(12) United States Patent
Kuehl et al.

(10) Patent No.: US 6,908,783 B1
(45) Date of Patent: Jun. 21, 2005

(54) METHOD OF DOPING ORGANIC SEMICONDUCTORS WITH QUINONEDIIMINE DERIVATIVES

(75) Inventors: Olaf Kuehl, Markkleeberg (DE); Horst Hartmann, Dresden (DE); Olaf Zeika, Theiben (DE); Martin Pfeiffer, Dresden (DE); Zheng Youxuan, Dresden (DE)

(73) Assignee: NovaLED GmbH, Dresden (DE)

( * ) Notice: Subject to any disclaimer, the term of this patent is extended or adjusted under 35 U.S.C. 154(b) by 0 days.

(21) Appl. No.: 10/792,133

(22) Filed: Mar. 3, 2004

(30) Foreign Application Priority Data

Dec. 4, 2003 (DE) .......................................... 103 57 044

(51) Int. Cl.[7] .......................... H01L 51/40; H01L 21/04; H01L 35/24

(52) U.S. Cl. ............................. 438/99; 438/510; 257/40
(58) Field of Search ...................... 438/99, 510; 257/40

*Primary Examiner*—David Zarneke
*Assistant Examiner*—Scott B. Geyer
(74) *Attorney, Agent, or Firm*—Baker Botts LLP

(57) ABSTRACT

The invention relates to the use of an organic mesomeric compound as organic dopant for doping an organic semi-conducting matrix material for varying the electrical properties thereof. In order to be able to handle organic semi-conductors more easily in the production process and to be able to produce electronic components with doped organic semiconductors more reproducibly, it is proposed that as mesomeric compound a quinone or quinone derivative or a 1,3,2-dioxaborine or a 1,3,2-dioxaborine derivative may be used, which under like evaporation conditions has a lower volatility than tetrafluorotetracyanoquinonedimethane (F4TCNQ).

29 Claims, 6 Drawing Sheets

METHOD OF DOPING ORGANIC SEMICONDUCTORS WITH QUINONEDIIMINE DERIVATIVES

CROSS REFERENCE TO RELATED APPLICATIONS

Figure 1:
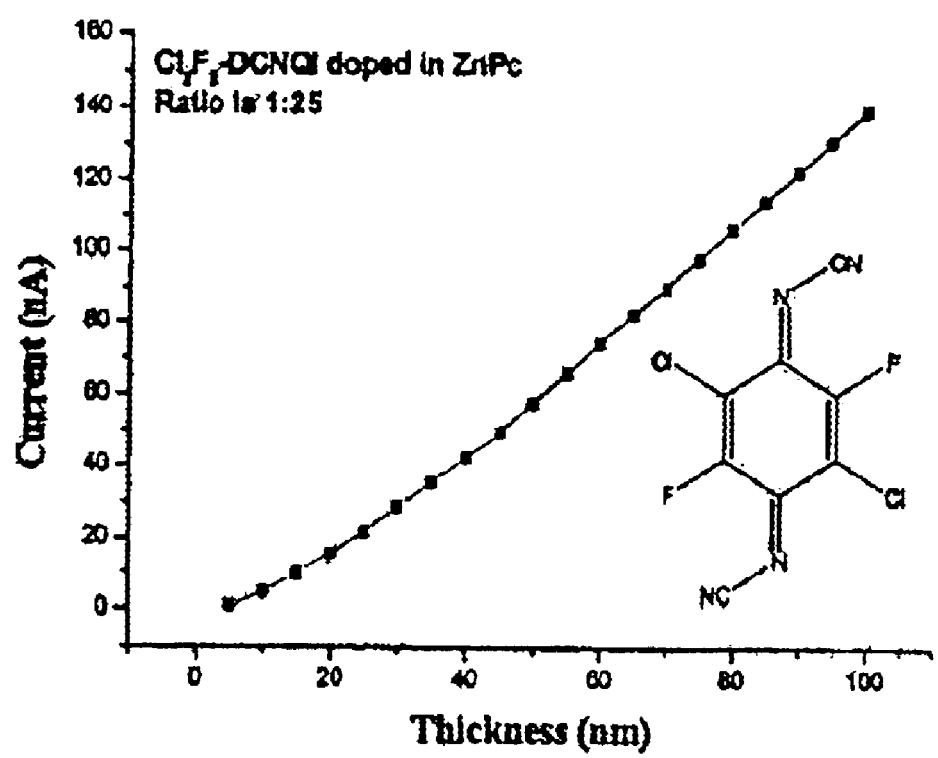
Figure 2:
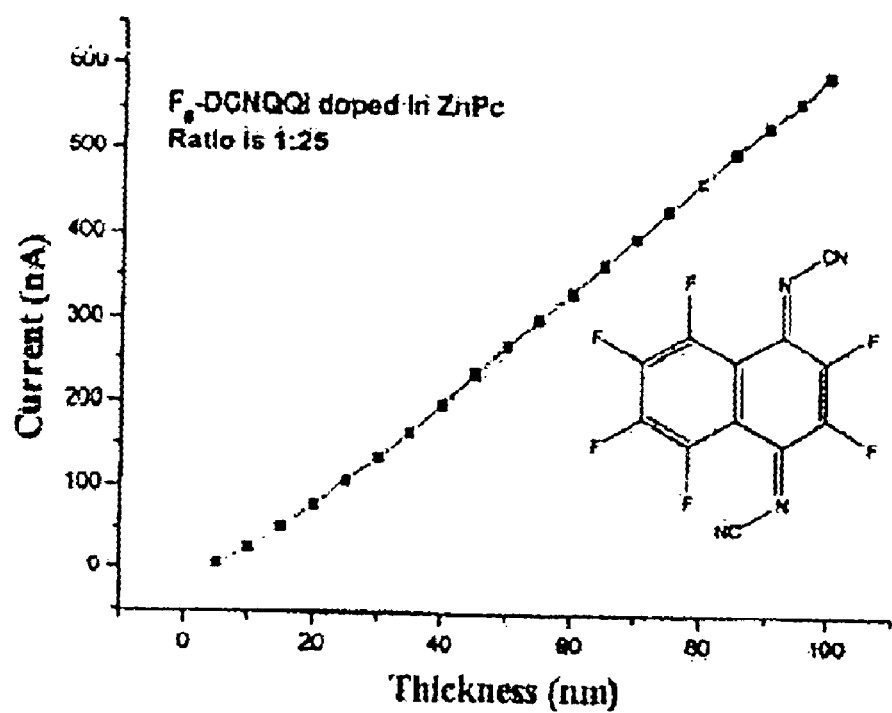
Figure 3:
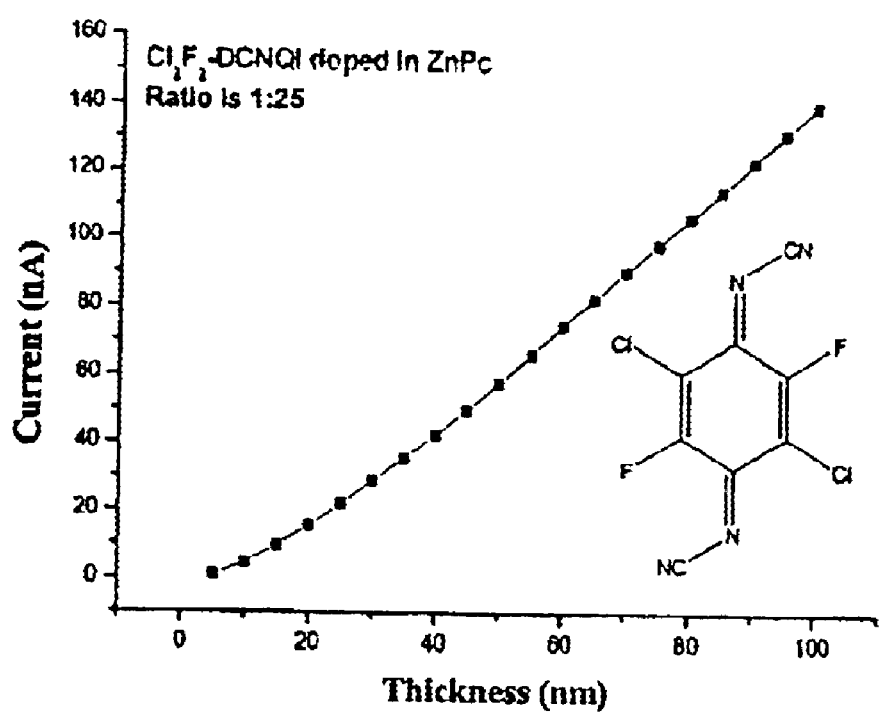
Figure 4:
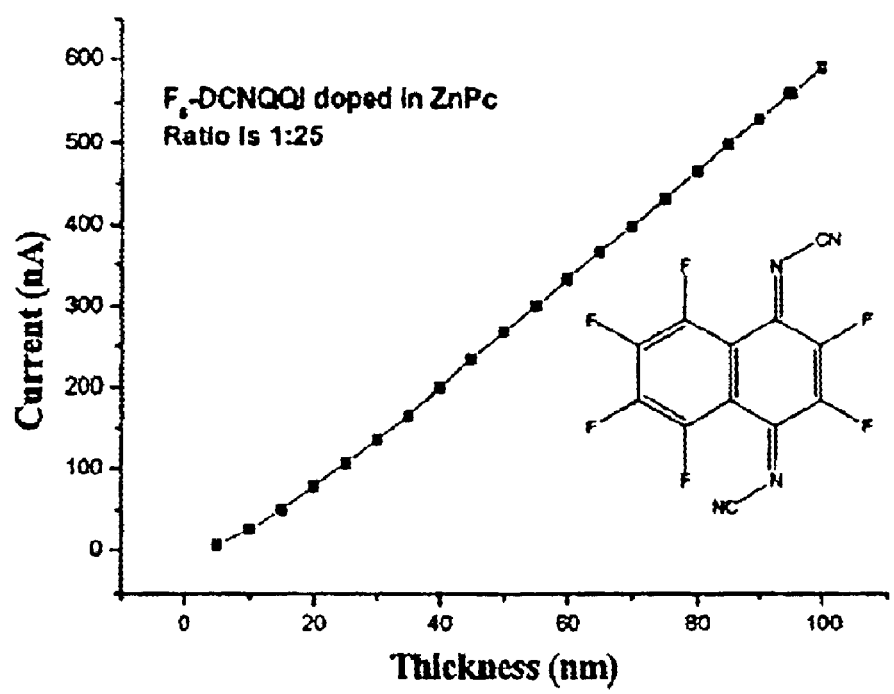
Figure 5:
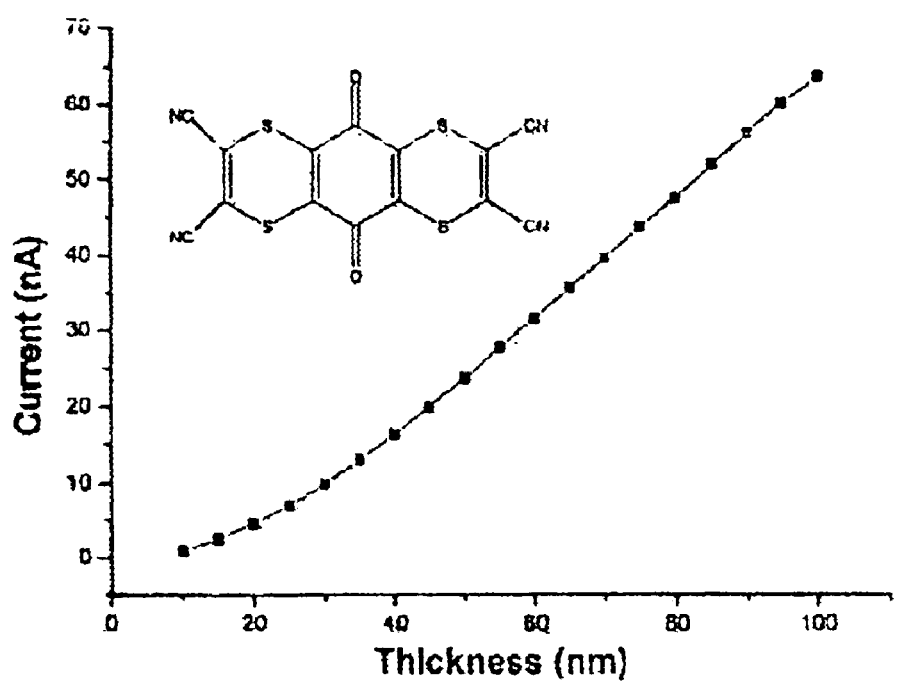
Figure 6:
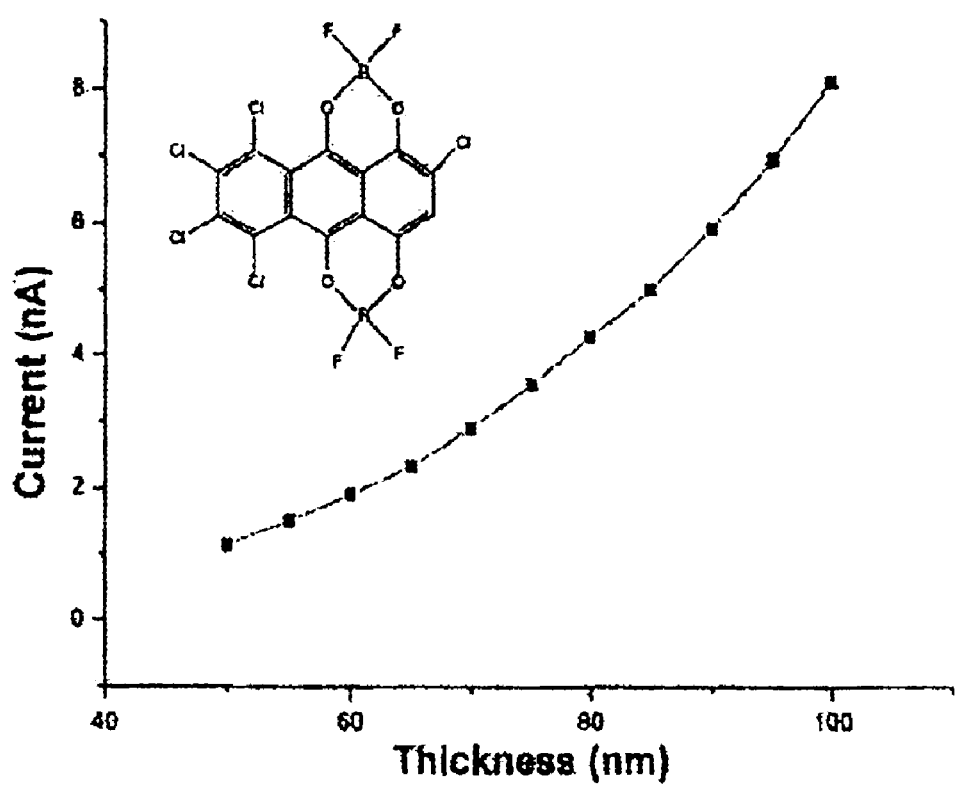

The present application claims priority to German Patent Application No. 103 57 044.6, filed Dec. 4, 2003, which is incorporated herein by reference in its entirety.

The invention relates to the use of an organic mesomeric compound as organic dopant for doping an organic semiconducting matrix material for varying the electrical properties thereof, a doped semiconducting matrix material, and an electronic component made of the latter.

The doping of silicon semiconductors has already been state of art for several decades. By this method, an increase in conductivity, initially quite low, is obtained by generation of charge carriers in the material as well as, depending upon the type of dopant used, a variation in the Fermi level of the semiconductor.

However, several years ago it was also disclosed organic semiconductors may likewise be strongly influenced with regard to their electrical conductivity by doping. Such organic semiconducting matrix materials may be made up either of compounds with good electron-donor properties or of compounds with good electron-acceptor properties. For doping electron-donor materials, strong electron acceptors such as tetracyanoquinonedimethane (TCNQ) or 2,3,5,6-tetrafluorotetracyano-1,4-benzoquinonedimethane (F4TCNQ) have become well known. M. Pfeiffer, A. Beyer, T. Fritz, K. Leo, Appl. Phys. Lett., 73 (22), 3202–3204 (1998) and J. Blochwitz, M. Pfeiffer, T. Fritz, K. Leo, Appl. Phys. Lett., 73 (6), 729–731 (1998). By electron transfer processes, these produce so-called holes in electron donor-like base materials (hole-transport materials), owing to the number and mobility of which the conductivity of the base material is relatively significantly varied. For example, N,N'-perarylated benzidines TPD or N,N',N''-perarylated starburst compounds, such as the substance TDATA, but also certain metal phthalocyanines, such as in particular zinc phthalocyanine ZnPc, are known as matrix materials with hole-transport properties.

However, the compounds previously investigated have disadvantages for technical use in the production of doped semiconducting organic layers or of suitable electronic components with doped layers of this kind, since the manufacturing processes in large technical production plants or those on a technical scale cannot always be sufficiently precisely controlled, which results in high control and regulation expense within the process in order to obtain the desired product quality, or to undesirable tolerances of the products. In addition, there are disadvantages in the use of previously known organic donors with regard to electronic component structures such as light-emitting diodes (OLEDs), field-effect transistors (FETs) or solar cells themselves, since the said production difficulties in the handling of dopants may result in undesirable heterogeneities in the electronic components or undesirable aging effects of the electronic components. At the same time, however, care has to be taken to see that the dopants to be used have appropriate electron affinities and other properties suitable for the particular application, since for example under certain conditions the dopants also help to determine the conductivity or other electrical properties of the organic semiconducting layer.

The object of the invention therefore is to prepare organic dopants for doping organic semiconductors which are easier to handle in the production process and which result in electronic components whose organic semiconducting materials are capable of being produced reproducibly.

According to the invention, this object is accomplished by the use of an organic mesomeric compound as organic dopant, which is a quinone or quinone derivative, in particular an unsubstituted, substituted or anellated quinone or quinone derivative, or a 1,3,2-dioxaborine or 1,3,2-dioxaborine derivative, in particular an unsubstituted, substituted or anellated 1,3,2-dioxaborine or 1,3,2-dioxaborine derivative and which under like conditions of evaporation has a lower volatility than tetrafluorotetracyanoquinonedimethane (F4TCNQ). To be understood as quinone derivatives in the sense of the invention are in particular quinoid systems in which one, two or more quinoid oxygen atoms is/are replaced by a mesomerically and/or inductively electron-attracting, double bond-bonded substituent, in particular by one of the substituents indicated below. By inductively electron-attracting are to be understood those residues which with respect to carbon have an inductive effect on in particular unsaturated hydrocarbon. Owing to the high evaporation temperature and low volatility under similar conditions, production processes can be controlled better and hence carried out with less effort and more reproducibly, while owing to the preparation of quinones and their derivatives or 1,3,2-dioxaborines and their derivatives as dopants, they permit sufficient electrical conductivity of the organic semiconducting matrix with favorable electron affinity of the dopants in the respective components at low coefficients of diffusion, which ensure component structures remaining constant over time. In addition, charge-carrier injection of contacts into the doped layer can be improved by the dopants. Additionally, the doped organic semiconducting material and the resulting electronic component, because of the compounds used according to the invention, can have improved long-term stability. This relates for example to a reduction in the dopant concentration with time. In addition, this relates to the stability of the doped layer, which is located adjacent to undoped layers of an electrooptical component, resulting in electrooptical components with high long-term stability of electrooptical properties such as luminous yield at a given wavelength, efficiency of a solar cell or the like.

Preferred refinements follow from the dependent claims.

Here volatility may be determined as the evaporation rate measured under like conditions (for example a pressure of $2 \times 10^{-4}$ Pa and a specified evaporation temperature, for example 150° C.) or as evaporation rate of a substrate measured as layer thickness growth per unit of time (nm/s) under otherwise like conditions. The volatility of the compounds according to the invention preferably is $\leq 0.95$ times or 0.9 times, especially preferably $\leq 0.8$ times, additionally preferably $\leq 0.5$ times, especially preferably $\leq 0.1$ times or $\leq 0.05$ times or $\leq 0.01$ times that of F4TCNQ or less.

The evaporation rate of the substrate with the compounds according to the invention may be determined for example by the use of a quartz thickness monitor, as is customarily used for example in the production of OLEDs. In particular, the ratio of the evaporation rates of matrix materials and dopants may be measured by independent measurements thereof with the use of two separate quartz thickness monitors in order to adjust the doping ratio.

The volatility relative to that of F4TCNQ may in each instance be referred to that of the pure compound or to the volatility in a given matrix material, for example ZnPc.

It goes without saying that the compounds used according to the invention preferably are procured in such a way that they evaporate relatively or practically undecomposed. Under certain circumstances, however, precursors may alternatively be selectively used as dopant sources, which release the compounds used according to the invention, for example acid addition salts, for example a volatile or non-volatile inorganic or organic acid, or charge-transfer complexes thereof, where the acids or electron donors preferably are not or are only slightly volatile or the charge-transfer complex itself works as dopant.

The dopant preferably is selected in such a way that under otherwise like conditions such as in particular doping concentration (molar ratio of dopant:matrix, layer thickness, current) in a given matrix material (for example zinc phthalocyanine or another matrix material mentioned further below) generates a conductivity just as high as or preferably higher than F4TCNQ, for example a conductivity (s/cm) greater than/equal to 1.1 times, 1.2 times or greater than/equal to 1.5 times or two times that of F4TCNQ as dopant.

The dopant used according to the invention preferably is selected in such a way that the semiconducting organic matrix material doped with it, after a temperature change from 100° C. to room temperature (20° C.) still has ≧20%, preferably ≧30%, especially preferably ≧50% or 60% of the conductivity (s/cm) of the value at 100° C.

According to the invention, a variety of quinone derivatives and in addition 1,3,2-dioxaborines may be used as dopants for the said preferred hole-transport materials HT.

Quinoid structures

In quinonoid compounds used according to the invention, one, two, three or four or all quinoid =O groups of the quinoid compound, which may represent an ortho or para-quinoid system, where alternatively mixed ortho-para quinoid systems may occur in multinuclear quinoid systems, may be selected from the group, as they are defined below for the substituents S1 to S11, S13 to S21, optionally alternatively without S1, the substituents being defined below.

For a quinoid compound used according to the invention, one, two, three, four or more or all substituents for a quinoid =O group may be selected from the group consisting of S1–S11, S14–S16, optionally alternatively without S1, or be selected from the group consisting of S1, S5–S14 and S16, optionally alternatively without S1, or be selected from the group consisting of S3, S4, S6–S10, S15, S16, optionally alternatively without S1.

Alternatively, for a quinoid compound used according to the invention one, two, three, four, or more or all substituents for a quinoid =O group may be selected from the group consisting of S1, S5, S7–S9, S11, S14, S16–S21, optionally alternatively without S1, or from the group S1, S5, S8, S9, S11, S14, S16, S18, optionally alternatively without S1.

In particular, one, two, three, four or more or all substituents for a quinoid group =O may be =C(CN) or =N(CN) or =N(NO₂) or =C(CN)(C(O)R) or =N(C(O)R). Preferably one, two, three or four or more or all quinoid substituents of the quinoid system contain a mesomerically linked —NO₂ and/or —C(O)R group.

Compounds having the following basic quinoid skeletons may be used according to the invention.

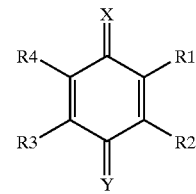

1

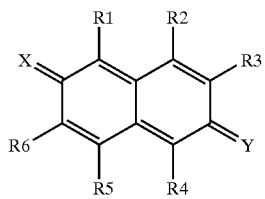

2

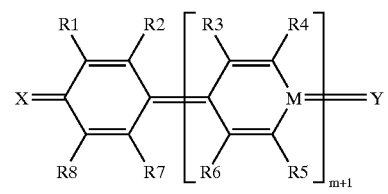

3

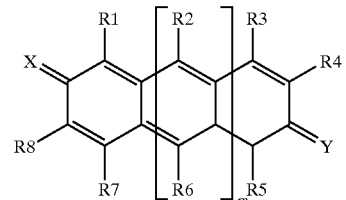

3b

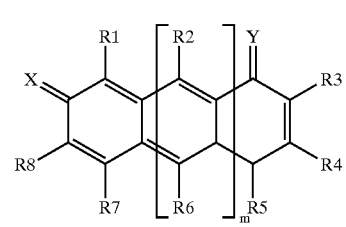

3c

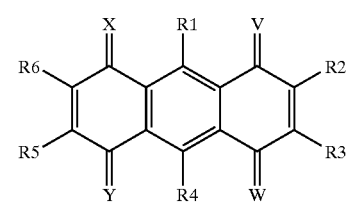

4

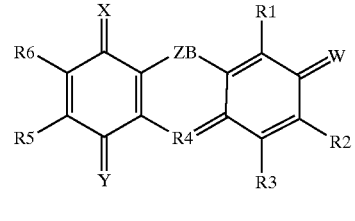

5

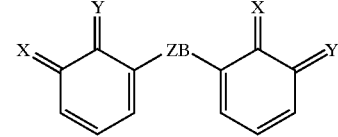

5b

5
-continued
5c
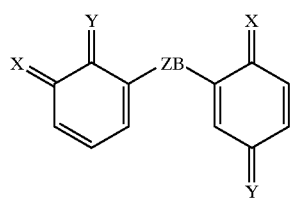
6
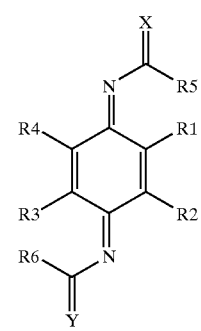
7
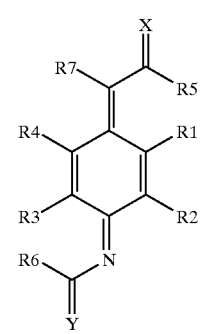
8
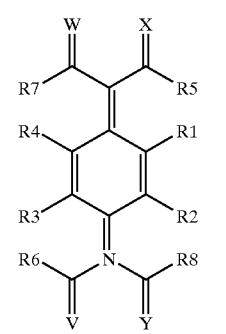
9
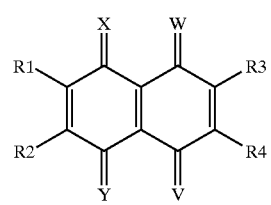
6
-continued
10
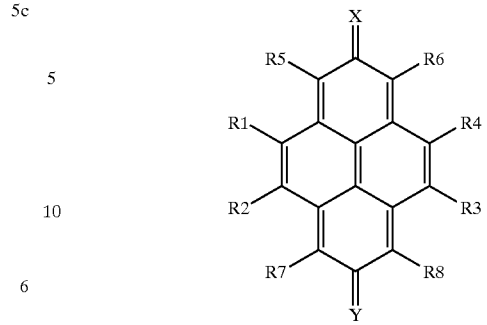
11
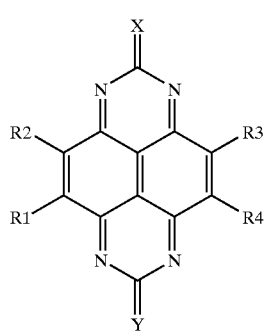
11a
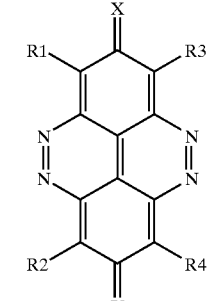
12
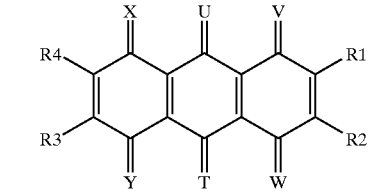
13
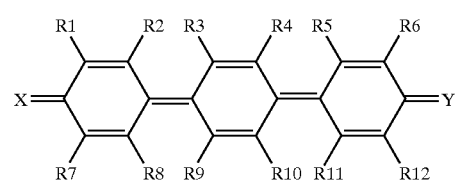
14
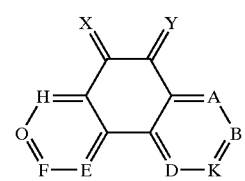

15
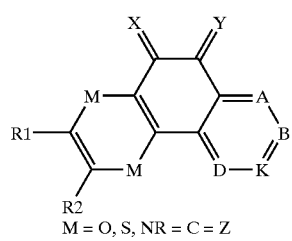
M = O, S, NR = C = Z
16
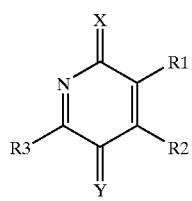
17
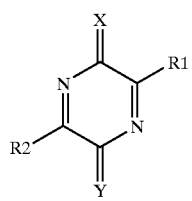
18
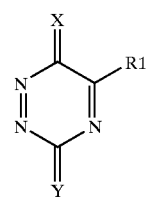
19
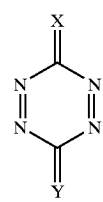
20
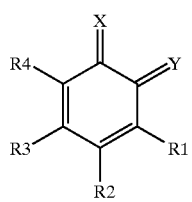
21
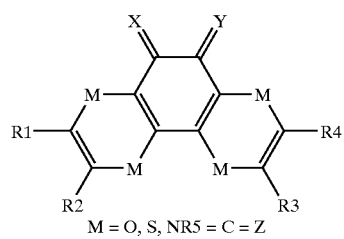
M = O, S, NR5 = C = Z
22
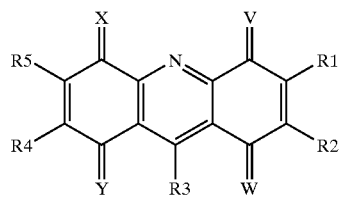
23
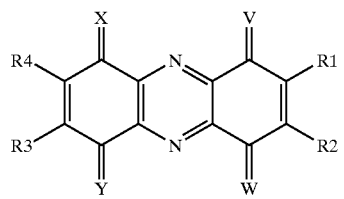
24
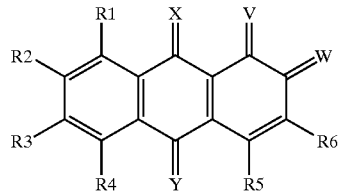
24a
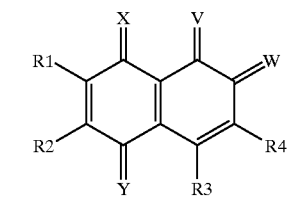
24b
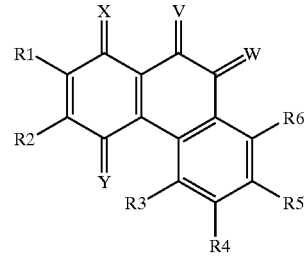
25
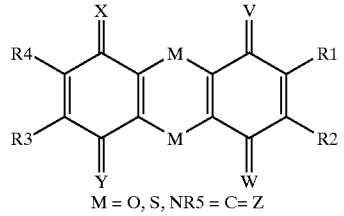
M = O, S, NR5 = C = Z
26
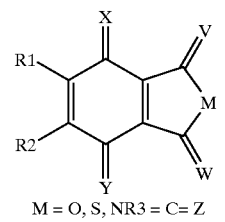
M = O, S, NR3 = C = Z -continued

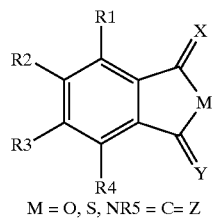
M = O, S, NR5 = C= Z

27

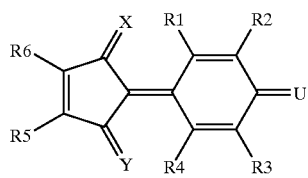

28

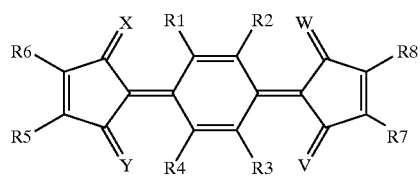

29

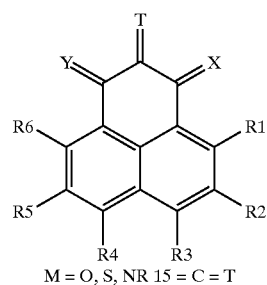
M = O, S, NR 15 = C = T

30

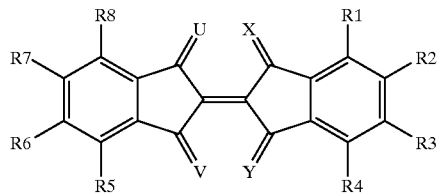

31

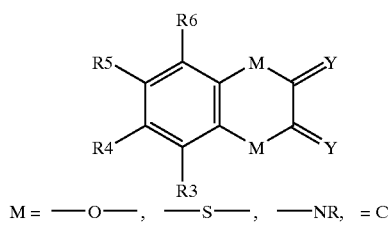
M = —O—, —S—, —NR, =C=Z

32

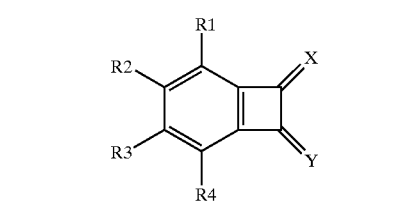

33 where in compounds 3, 3b, 3c m may be 0, 1, 2, 3, 4 to 6 or greater,
and where in addition, in compounds 25–27 the substituent Z of a group M may be alike or unlike another substituent X, Y, V, W,
where in compound 25 the two groups M or for M equals =C=Z the two groups Z may be alike or unlike,
and where in compound 32 preferably one or both groups M are not =C=Z.

It goes without saying that the compounds indicated in each instance may comprise all stereoisomers, in particular syn and anti isomers, providing that these are sterically possible in each instance.

Here the substituents T, U, V, W. X, Y and Z preferably represent mesomeric and/or referred to carbon or a hydrocarbon, in particular a saturated hydrocarbon, inductively attracting double bond-bonded substituents.

In particular, for compounds 1–33 the substituents T, U, V, W, X, Y and/or Z may in each instance be unlike or alike and be selected from the group consisting of:

S1

NC\_\_\_CN

S2

NC\_\_\_NO$_2$

S3

O$_2$N\_\_\_NO$_2$

S4

O$_2$N\_\_\_C(O)R$^{13}$

S5

NC\_\_\_C(O)R$^{14}$

S6

F$_3$C\_\_\_CF$_3$

S7

R$^{15}$(O)C\_\_\_C(O)R$^{16}$

S8

N\_\_\_R$^{17}$

S9

N\_\_\_C(O)R$^{18}$

S10

N\_\_\_NO$_2$

S11

N\_\_\_CN

S12

=O

S13

=S

-continued

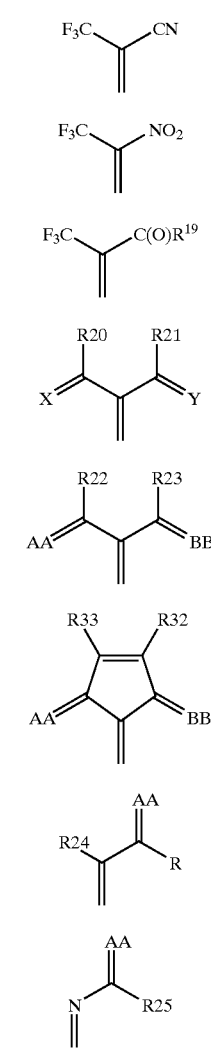

where R preferably is an organic residue or hydrogen. R17 may in particular alternatively be —CF₃, or perfluoroalkyl, in particular with C1–C6. If the substituent is S17, X and Y of the substituent S17 preferably are not again S17 and/or S18 to S21.

The substituents T, U, V, W, X and/or Z in compounds 1–33 may in particular in each instance be alike or unlike and be selected from the group consisting of

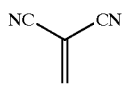 S1

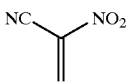 S2

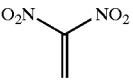 S3

-continued

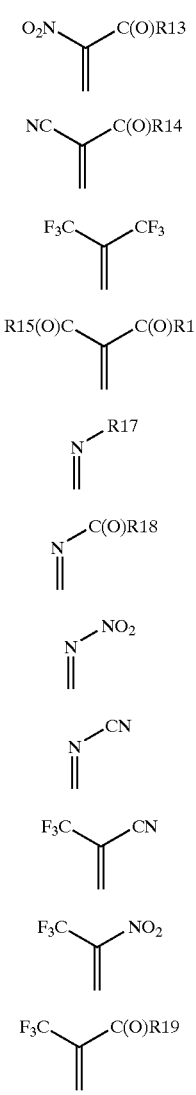

where R preferably is an organic residue or hydrogen, while R17 of group S8 in particular may alternatively be —CF₃ or in general perfluoroalkyl, in particular with C1 to C6. In particular, one, two, three, four or all of the substituents may be selected from this group. In particular, X and Y may be alike or unlike and X or Y or X and Y may be selected from this group. In particular, V and W may alternatively or additionally be alike or unlike and V or W or V and W may be selected from this group.

The substituents T, U, V, W, X, Y and/or Z in compounds 1 to 33 may in each instance be alike or unlike and be selected from the group consisting of

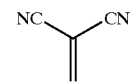 S1

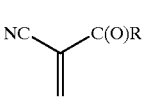 S5

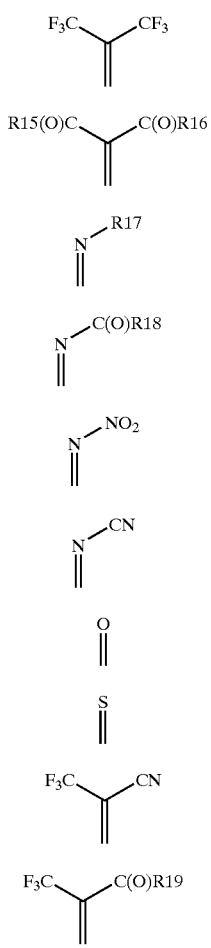

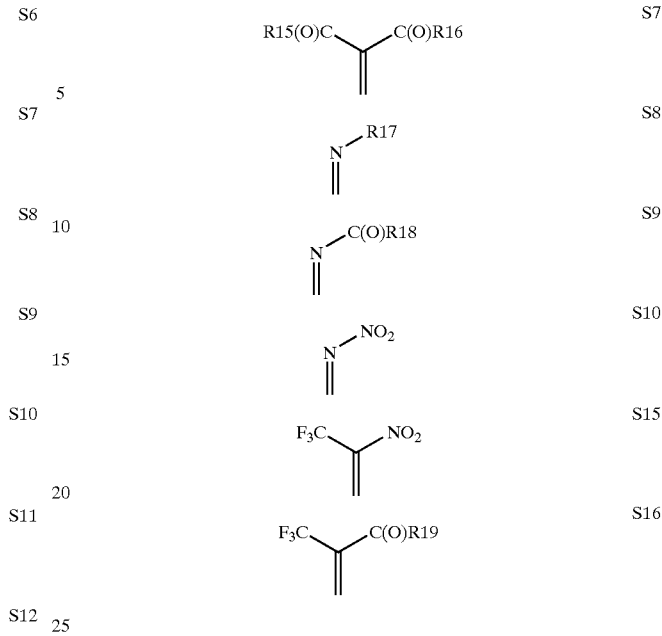

where R preferably is an organic residue or hydrogen, while R17 of group S8 in particular may alternatively be —CF₃ or in general perfluoroalkyl, in particular with C1 to C6. In particular, one, two, three, four or all of the substituents may be selected from this group. In particular, X and Y may be alike or unlike and X or Y or X and Y may be selected from this group. In particular, alternatively or additionally, V and W may be the alike or unlike and V or W or V and W may be selected from this group.

The substituents T, U, V, W, X, Y and/or Z in compounds 1 to 33 may in each instance be alike or unlike and may be selected from the group consisting of

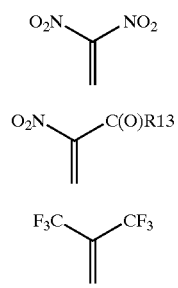

where R preferably is an organic residue or hydrogen, while R17 of the group S8 in particular may alternatively be —CF₃ or in general perfluoroalkyl, in particular with C1 to C6. In particular, one, two, three, four or all of the substituents may be selected from this group. In particular, X and Y may be alike or unlike and X or Y or X and Y may be selected from this group. In particular, alternatively or additionally, V and W may be alike or unlike and V or W or V and W may be selected from this group.

The substituents T, U, V, W, X, Y and/or Z in compounds 1 to 33 may alternatively in each instance be alike or unlike and be selected from the group consisting of S1, S5, S7–S9, S11, S14, S16–S21, optionally alternatively without S1, or from the group S1, S5, S8, S9, S11, S14, S16, S18, optionally alternatively without S1. In particular, one, two, three, four or all of the substituents may be selected from this group. In particular, X and Y may be alike or unlike and X or Y or X and Y may be selected from this group. In particular, alternatively or additionally, V and W may be alike or unlike and V or W or V and W may be selected from this group.

The following relationships between the substituents may apply to compounds 1 to 33. The following substituent relationships may in particular apply to the group of substituents S1 to S21. The following substituent relationships may apply to the group of substituents S1 to S11, S14 to S16. The following substituent relationships may apply to the group of substituents S1, S5–S14, S16. The following substituent relationships may apply to the group S3, S4, S6–S10, S15, S16.

X and/or Y may not or may not simultaneously be =O or =C(CN)2. This applies in particular to a mononuclear quinoid dopant, whose substituents preferably form or represent one or no aromatic ring system. In particular, this may apply to the compounds 1 and 20. Alternatively or additionally, V and/or W may not or may not simultaneously be =O or =C(CN)2.

Preferably, in the compound used according to the invention, in each instance =X and =X are alike and/or =U and =T are alike and/or =V and =W are alike.

The substituents AA and BB preferably are in each instance alike, and may alternatively be unlike one another.

At least one or two of the substituents in the group =X, =Y, =U, =V, =T, =W, =Z or all substituents in the said group may be unlike =O.

=X and =Y may be unlike =O.

Preferably, at least one or two of the substituents in the group =X, =Y, =U, =V, =T, =W, =Z or all substituents in the group are unlike =S.

Preferably at least one or both substituents in the group =X and =Y are unlike =S.

At least one or two of the substituents in the group =X and =Y, =U, =V, =T, =W, =Z or all substituents in the group may unlike =C(CN)$_2$.

At least one or both substituents in the group =X and =Y may be unlike =C(CN)$_2$.

Preferably at least one or both substituents in the group =X and =Y are =N(CN). Preferably, alternatively or additionally, one or both substituents =V and =W are =N(CN) and/or one or both substituents =U and =T are =N(CN).

Preferably at least one or both substituents in the group =X and =Y and/or one or both substituents in the group =V and =W equal =N(NO2).

Preferably at least one or both substituents in the group =X and =Y and/or one or both substituents in the group =V and =W equal =NR, where R may alternatively be —CF$_3$ or in general perfluoroalkyl, in particular with C1–C6.

Preferably at least one or both substituents in the group =X and =Y and/or one or both substituents in the group =V and =W equal =N(C(O)R$^{18}$.

Preferably at least one or both substituents in the group =X and =Y and/or one or both substituents in the group =V and =W equal C(NO$_2$)$_2$.

Preferably at least one or both substituents in the group =X and =Y and/or one or both substituents in the group =V and =W equal =C(C(O)R$^{13}$) (C(O)R$^{14}$).

Preferably at least one or both substituents in the group =X and =Y and/or one or both substituents in the group =V and =W equal =C(CF$_3$)$_2$ or in general =C(perfluoroalkyl)2, in particular with C1–C6.

Preferably at least one or two or more or all substituents in the group =X, =Y, =U, =V, =T, =W, =Z equal =N(CN).

Preferably at least one or two or more or all substituents in the group =X, =Y, =U, =V, =T, =W=Z equal =C(NC$_2$)$_2$ or contain a NO$_2$ group conjugated with the quinoid system.

Preferably at least one or two or more or all substituents in the group =X, =Y, =U, =V, =T, =W, =Z equal =N(NO2).

Preferably at least one or two or more or all substituents in the group =X, =Y, =U, =V, =T, =W, =Z are =NR, where R may in particular alternatively be —CF$_3$ or perfluoroalkyl with in particular C1–C6.

Preferably at least one or two or more or all substituents in the group =X, =Y, =U, =V, =T, =W, =Z are =N(C(O)R$^{18}$).

Preferably at least one or two or more or all substituents in the group =X, =Y, =U, =V, =T, =W, =Z are =C(C(O)R$^{13}$)(C(O)R$^{14}$) or contain a C(O)R group conjugated with the quinoid system.

Preferably at least one or two or more or all substituents in the group =X, =Y, =U, =V, =T, =W, =Z are =C(CF$_3$)$_2$ or in general =C(perfluoroalkyl)$_2$, in particular with C1–C6.

In particular, for the compounds 1–31X may be =Y in each instance or all substituents X, Y, U, V, T, W, Z may be alike, without being limited thereto. Correspondingly, in a quinoid compound generally all quinoid substituents may be alike.

Optionally X or Y or X and Y are not O, in particular for the compounds [ . . . ] or 1 or 20 or for compounds with only one quinoid ring. Optionally X or Y or X and Y are not S, in particular for the compounds 1 or 20. Optionally X or Y or X and Y are not =C(CN)$_2$, in particular for compounds 1 or 20. This applies in particular to a compound with only one 6-membered quinoid ring, in particular to a ring with 6 C atoms.

If the compound has at least one or two or more quinoid =O groups and/or =S groups, in particular when this applies in one of the compounds 1 to 33, to T, U, V, W, X, Y or Z, in particular in the case when X or Y or X and Y is O or S, the quinoid ring, in particular when only one quinoid ring is present, preferably with at least one or at least two aryl residues, of which one, more or all may alternatively have heteroatoms, is anellated or substituted.

The substituents AA and/or BB are double-bond, mesomerically and/or inductively electron-attracting substituents, preferably selected from the following group

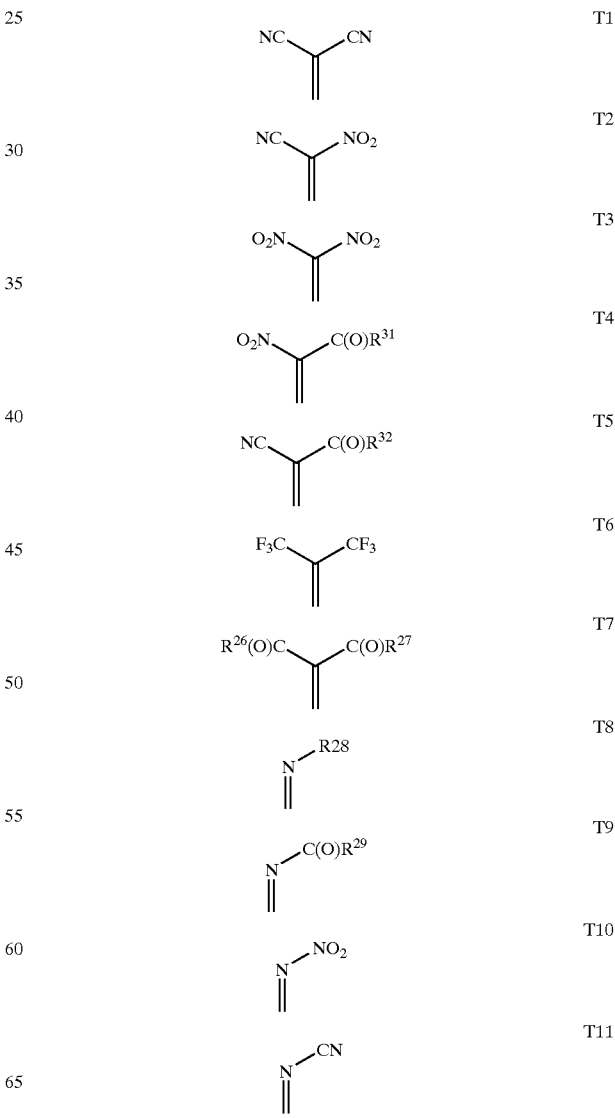

17

-continued

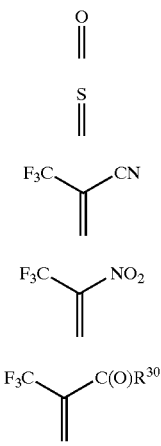

T12

T13

T14

T15

T16 where optionally other suitable divalent, in particular including double-bond, substituents may alternatively be used. R28 may in particular alternatively be —CF$_3$ or another perfluoroalkyl group, preferably with C1–C6.

The compound according to the invention may represent a quinoid system with a quinoid ring and 1, 2 or 3 or more anellated and/or in each instance aromatic rings forming a residue R. The aromatic rings may in each instance have one or more heteroatoms and be substituted or unsubstituted. The quinoid system may be an ortho or para quinoid system. The quinoid system may in particular be selected from the group of compounds 1–33, without being limited thereto. One, two, three or more or all of the aromatic rings may alternatively be alike or unlike by a group —M1—C(R)═C(R)═C(R)—M2— or —M1—C(═Z)—M2— with M1, M2 and be selected from the group —O—, —S—, —NR—.

The invention in addition comprises compounds with a quinoid system of two rings of 5 or 6 ring atoms in each instance, which may be anellated with 1, 2, 3, 4, 5 or 6 or more aromatic rings and/or be substituted with formation of a residue R. The aromatic rings may be substitute or unsubstituted.

The rings in each instance preferably have 6 atoms, which may be 6 carbon atoms. In one or more rings or in each compound as a whole, 1, 2, 3 or 4 or more C atoms may be replaced by heteroatoms such as O, S, N. A variety of quinoid systems may be anellated, mesomerically bonded by one or more double or triple bonds, which may be C—C bonds or heteroatom-C— bonds, or otherwise linked. The bond may in particular be selected from the group of compounds 1–33, without being limited thereto. One, two, three or more or all of the aromatic rings may alternatively be alike or unlike M1, M2 by a group —M1—C(R)═C(R)—M2 or —M1—C(═Z)—M2— and be selected from the group —O—, —S—, —NR—.

In addition, the invention relates to compounds having 3 or 4 quinoid rings of 5 or 6 atoms independent of one another in each instance, which may have 1, 2, 3, 4, 5, 6, 7, 8, 9 or 10 anellated aromatic rings or forming a residue R with 6 atoms. The aromatic rings may be substituted or unsubstituted. Of the carbon atoms of a ring, a plurality of rings or the compound as a whole 1, 2, 3 or 4 atoms may be heteroatoms such as O, N or P. The compound may in particular be selected from the group of compounds 1–33, without being limited thereto. One, two, three or more or all of the aromatic rings may alternatively be alike or unlike M1, M2 by a group —M1—C(R)═C(R)—M2 or —M1—C(═Z)—M2— and be selected from the group —O—, —S—, —NR—.

18

Irrespective thereof, the compounds used according to the invention may have 1, 2, 3, 4, 5, 6, 7, 8, 9 or 10 aryl residues, of which preferably at least one, more or especially preferably all are anellated with one or more quinoid systems and/or with one another, and/or form the residues R. The aromatic rings may be substituted or unsubstituted. Here heteroaryl residues are also to be understood as aryl residues. The aryl residues may in each instance link two quinoid rings to one another, preferably with mesomeric linkage of the quinoid rings. The quinoid system may in particular be selected from the group of compounds 1–33, without being limited thereto. One, two, three or more or all of the aromatic rings may alternatively be alike or unlike M1, M2 by a group —M1—C(R)═C(R)—M2 or —M1—C(═Z)—M2— and be selected from the group —O—, —S—, —NR—. Thus, for example, in the compounds 4, 22 or 23 in each instance 2 or 3 or more (hetero)aryl rings may be located between the quinoid rings, bridging them.

The aromatic rings of the said quinoid systems and/or the groups —M1—C(R)═C(R)—M2 or —M1—C(═Z)—M2— are preferably perhalogenated, in particular perfluorinated or percyano-substituted. Preferably no additional non-aromatic and/or non-quinoid rings are contained.

Irrespective thereof, the compounds used according to the invention may have 2, 3, 4, 5 or 6 or more quinoid ring systems. Preferably, one, more or all of the quinoid rings are 5 or 6-membered. Ring carbon atoms may be replaced by heteroatoms. At least two, more or all of the quinoid rings may be anellated together with mesomeric linkage to form a larger quinoid system or be mesomerically linked by one or more bridges or not linked with formation of a larger mesomeric system. The compound may in particular be selected from the group of compounds 1–33, without being limited thereto. The quinoid system may in particular be selected from the group of compounds 1–33, without being limited thereto. One, two, three or more or all of the aromatic rings may alternatively be alike or unlike M1, M2 by a group —M1—C(R)═C(R)—M2 or —M1—C(═Z)—M2— and be selected from the group —O—, —S—, —NR—.

The substituents A, B, K, D, E, F, G, H of the compounds 14 and 15 may be unlike or alternatively alike and assume the following structures, imionitrogen ═N—, phosphine ═P— or the substituted methylene carbon ═C═R$^{1-8}$.

It is understood that in all compounds according to the invention, a plurality or all N atoms may in each instance be replaced by P atoms.

In particular, the following compounds with the following substitution patterns may be used according to the invention:

The compounds 1, 2, 3(m=0), 3(m=1), 3(m=3), 3(m=4), 3b(m=1), 3b(m=2), 3b(m=3), 3b(m=4), 3c(m=1), 3c(m=2), 3c(m=3, 3c(m=4), 6, 7, 10, 11, 11a, 14, 15, 16, 17, 18, 19, 20, 21 (for M unlike ═C═Z), 26 (for M unlike ═C═Z), 27 (for M like —O—, —S—, —NR— or ═C═Z with Z=S1, S2, S3, S4, S5, S6, S7, S8, S9, S10, S11, S12, S13, S14, S15, S16, S17, S18, S19, S20 or S21), 28 (for U=S1, S2, S3, S4, S5, S6, S7, S8, S9, S10, S11, S12, S13, S14, S15, S16, S17, S18, S19, S20 or S21), 30 (with M equal to —O—, —S—, —NR— or ═C T with T=S1, S2, S3, S4, S5, S6, S7, S8, S8, S10, S11, S12, S13, S14, S15, S16, S17, S18, S19, S20 or S21), 32, 33 in particular have the following concrete substitution patterns in each instance, where to each one of the compounds in succession is assigned the substituent X of a first line and the substituent Y below it of the following line with X and Y in each instance as follows X: S1, S1, S1, S1, S1, S1, S1, S1, S1, S1, S1, S1, S1,
Y: S1, S2, S3, S4, S5, S6, S7, S8, S9, S10, S11, S12, S13, S14, X: S1, S1, S1, S1, S1, S1, S1
Y: S15, S16, S17, S18, S19, S20, S21
or with X and Y in each instance as follows:
X: S2, S2, S2, S2, S2, S2, S2, S2, S2, S2, S2, S2, S2, S2,
Y: S1, S2, S3, S4, S5, S6, S7, S8, S9, S10, S11, S12, S13, S14,
X: S2, S2, S2, S2, S2, S2, S2
Y: S15, S16, S17, S18, S19, S20, S21
or with X and Y in each instance as follows:
X: S3, S3, S3, S3, S3, S3, S3, S3, S3, S3, S3, S3, S3, S3,
Y: S1, S2, S3, S4, S5, S6, S7, S8, S9, S10, S11, S12, S13, S14,
X: S3, S3, S3, S3, S3, S3, S3
Y: S15, S16, S17, S18, S19, S20, S21
or with X and Y in each instance as follows:
X: S4, S4, S4, S4, S4, S4, S4, S4, S4, S4, S4, S4, S4, S4,
Y: S1, S2, S3, S4, S5, S6, S7, S8, S9, S10, S11, S12, S13, S14,
X: S4, S4, S4, S4, S4, S4, S4
Y: S15, S16, S17, S18, S19, S20, S21
or with X and Y in each instance as follows:
X: S5, S5, S5, S5, S5, S5, S5, S5, S5, S5, S5, S5, S5, S5,
Y: S1, S2, S3, S4, S5, S6, S7, S8, S9, S10, S11, S12, S13, S14,
X: S5, S5, S5, S5, S5, S5, S5
Y: S15, S16, S17, S18, S19, S20, S21
Or with X and Y in each instance as follows:
X: S6, S6, S6, S6, S6, S6, S6, S6, S6, S6, S6, S6, S6, S6,
Y: S1, S2, S3, S4, S5, S6, S7, S8, S9, S10, S11, S12, S13, S14,
X: S6, S6, S6, S6, S6, S6, S6
Y: S15, S16, S17, S18, S19, S20, S21
Or with X and Y in each instance as follows:
X: S7, S7, S7, S7, S7, S7, S7, S7, S7, S7, S7, S7, S7, S7,
Y: S1, S2, S3, S4, S5, S6, S7, S8, S9, S10, S11, S12, S13, S14,
X: S7, S7, S7, S7, S7, S7, S7
Y: S15, S16, S17, S18, S19, S20, S21
Or with X and Y in each instance as follows:
X: S8, S8, S8, S8, S8, S8, S8, S8, S8, S8, S8, S8, S8, S8,
Y: S1, S2, S3, S4, S5, S6, S7, S8, S9, S10, S11, S12, S13, S14,
X: S8, S8, S8, S8, S8, S8, S8
Y: S15, S16, S17, S18, S19, S20, S21
Or with X and Y in each instance as follows:
X: S9, S9, S9, S9, S9, S9, S9, S9, S9, S9, S9, S9, S9, S9,
Y: S1, S2, S3, S4, S5, S6, S7, S8, S9, S10, S11, S12, S13, S14,
X: S9, S9, S9, S9, S9, S9, S9
Y: S15, S16, S17, S18, S19, S20, S21
Or with X and Y in each instance as follows:
X; S10, S10, S10, S10, S10, S10, S10, S10, S10, S10, S10, S10,
Y: S1, S2, S3, S4, S5, S6, S7, S8, S9, S10, S11, S12,
X: S10, S10, S10, S10, S10, S10, S10, S10, S10
Y: S13, S14, S15, S16, S17, S18, S19, S20, S21
Or with X and Y in each instance as follows:
X: S11, S11, S11, S11, S11, S11, S11, S11, S11, S11, S11, S11,
Y: S1, S2, S3, S4, S5, S6, S7, S8, S9, S10, S11, S12,
X: S11, S11, S11, S11, S11, S11, S11, S11
Y: S13, S14, S15, S16, S17, S18, S19, S20, S21
or with X and Y in each instance as follows:
X: S12, S12, S12, S12, S12, S12, S12, S12, S12, S12, S12, S12,
Y: S1, S2, S3, S4, S5, S6, S7, S8, S9, S10, S11, S12,
X: S12, S12, S12, S12, S12, S12, S12, S12

Y: S13, S14, S15, S16, S17, S18, S19, S20, S21
or with X and Y in each instance as follows:
X: S13, S13, S13, S13, S13, S13, S13, S13, S13, S13, S13, S13,
Y: S1, S2, S3, S4, S5, S6, S7, S8, S9, S10, S11, S12,
X: S13, S13, S13, S13, S13, S13, S13, S13
Y: S13, S14, S15, S16, S17, S18, S19, S20, S21
or with X and Y in each instance as follows:
X: S14, S14, S14, S14, S14, S14, S14, S14, S14, S14, S14, S14,
Y: S1, S2, S3, S4, S5, S6, S7, S8, S9, S10, S11, S12,
X: S14, S14, S14, S14, S14, S14, S14, S14
Y: S13, S14, S15, S16, S17, S18, S19, S20, S21
or with X and Y in each instance as follows:
X: S15, S15, S15, S15, S15, S15, S15, S15, S15, S15, S15, S15,
Y: S1, S2, S3, S4, S5, S6, S7, S8, S9, S10, S11, S12,
X: S15, S15, S15, S15, S15, S15, S15, S15
Y: S13, S14, S15, S16, S17, S16, S19, S20, S21
or with X and Y in each instance as follows:
X: S16, S16, S16, S16, S16, S16, S16, S16, S16, S16, S16,
Y: S1, S2, S3, S4, S5, S6, S7, S8, S9, S10, S11, S12,
X: S16, S16, S16, S16, S16, S16, S16, S16
Y: S13, S14, S15, S16, S17, S18, S19, S20, S21
or with X and Y in each instance as follows:
X: S17, S17, S17, S17, S17, S17, S17, S17, S17, S17, S17, S17,
Y: S1, S2, S3, S4, S5, S6, S7, S8, S9, S10, S11, S12,
X: S17, S17, S17, S17, S17, S17, S17, S17
Y: S13, S14, S15, S16, S17, S18, S19, S20, S21
or with X and Y in each instance as follows:
X: S18, S18, S18, S18, S18, S18, S18, S18, S18, S18, S18, S18,
Y: S1, S2, S3, S4, S5, S6, S7, S8, S9, S10, S11, S12,
X: S18, S18, S18, S18, S18, S18, S18, S18
Y: S13, S14, S15, S16, S17, S18, S19, S20, S21
or with X and Y in each instance as follows:
X: S19, S19, S19, S19, S19, S19, S19, S19, S19, S19, S19, S19,
Y: S1, S2, S3, S4, S5, S6, S7, S8, S9, S10, S11, S12,
X: S19, S19, S19, S19, S19, S19, S19, S19
Y: S13, S14, S15, S16, S17, S18, S19, S20, S21
or with X and Y in each instance as follows:
X: S20, S20, S20, S20, S20, S20, S20, S20, S20, S20, S20, S20,
Y: S1, S2, S3, S4, S5, S6, S7, S8, S9, S10, S11, S12,
X: S20, S20, S20, S20, S20, S20, S20, S20, S20
Y: S13, S14, S15, S16, S17, S18, S19, S20, S21
or with X and Y in each instance as follows:
X: S21, S21, S21, S21, S21, S21, S21, S21, S21, S21, S21, S21,
Y: S1, S2, S3, S4, S5, S6, S7, S8, S9, S10, S11, S12,
X: S21, S21, S21, S21, S21, S21, S21, S21, S21
Y: S13, S14, S15, S16, S17, S18, S19, S20, S21.

The compounds 4, 5, 5b, 5c, 8, 9, 12, 21 (where 2 residues M are equal to V and W), 22, 23, 24, 24a, 24b, 25 and 26 (for M unlike =C=Z), 27 (for M unlike =C=Z), 29, 31 in particular have the following concrete substitution patterns in each instance, where to each one of the compounds in succession is assigned the substituent X of a first line and the substituent V below it of the following line, as indicated at the beginning of the line in each instance.

with X=Y and V=W and with X and V as follows:

X: S1, S1, S1, S1, S1, S1, S1, S1, S1, S1, S1, S1, S1, S1,
V: S1, S2, S3, S4, S5, S6, S7, S8, S9, S10, S11, S12, S13, S14,
X: S1, S1, S1, S1, S1, S1, S1
V: S15, S16, S17, S18, S19, S20, S21
or with X and V as follows:
X: S2, S2, S2, S2, S2, S2, S2, S2, S2, S2, S2, S2, S2, S2,
V: S1, S2, S3, S4, S5, S6, S7, S8, S9, S10, S11, S12, S13, S14,
X: S2, S2, S2, S2, S2, S2, S2
V: S15, S16, S17, S18, S19, S20, S21
or with X and V as follows:
X: S3, S3, S3, S3, S3, S3, S3, S3, S3, S3, S3, S3, S3, S3,
V: S1, S2, S3, S4, S5, S6, S7, S8, S9, S10, S11, S12, S13, S14,
X: S3, S3, S3, S3, S3, S3, S3
V: S15, S16, S17, S18, S19, S20, S21
or with X and V as follows:
X: S4, S4, S4, S4, S4, S4, S4, S4, S4, S4, S4, S4, S4, S4,
V: S1, S2, S3, S4, S5, S6, S7, S8, S9, S10, S11, S12, S13, S14,
X: S4, S4, S4, S4, S4, S4, S4
V: S15, S16, S17, S18, S19, S20, S21
or with X and V as follows:
X: S5, S5, S5, S5, S5, S5, S5, S5, S5, S5, S5, S5, S5, S5,
V: S1, S2, S3, S4, S5, S6, S7, S8, S9, S10, S11, S12, S13, S14,
X: S5, S5, S5, S5, S5, S5, S5
V: S15, S16, S17, S18, S19, S20, S21
or with X and V as follows:
X: S6, S6, S6, S6, S6, S6, S6, S6, S6, S6, S6, S6, S6, S6,
V: S1, S2, S3, S4, S5, S6, S7, S8, S9, S10, S11, S12, S13, S14,
X: S6, S6, S6, S6, S6, S6, S6
V: S15, S16, S17, S18, S19, S20, S21
or with X and V as follows:
X: S7, S7, S7, S7, S7, S7, S7, S7, S7, S7, S7, S7, S7, S7,
V: S1, S2, S3, S4, S5, S6, S7, S8, S9, S10, S11, S12, S13, S14,
X: S7, S7, S7, S7, S7, S7, S7
V: S15, S16, S17, S18, S19, S20, S21
or with X and V as follows:
X: S8, S8, S8, S8, S8, S8, S8, S8, S8, S8, S8, S8, S8, S8,
V: S1, S2, S3, S4, S5, S6, S7, S8, S9, S10, S31, S12, S13, S14,
X: S8, S8, S8, S8, S8, S8, S8
V: S15, S16, S17, S18, S19, S20, S21
or with X and V as follows:
X: S9, S9, S9, S9, S9, S9, S9, S9, S9, S9, S9, S9, S9, S9,
V: S1, S2, S3, S4, S5, S6, S7, S8, S9, S10, S11, S12, S13, S14,
X: S9, S9, S9, S9, S9, S9, S9
V: S15, S16, S17, S18, S19, S20, S21
or with X and V as follows:
X: S10, S10, S10, S10, S10, S10, S10, S10, S10, S10, S10, S10,
V: S1, S2, S3, S4, S5, S6, S7, S8, S9, S10, S11, S12,
X: S10, S10, S10, S10, S10, S10, S10, S10, S10
V: S13, S14, S15, S16, S17, S18, S19, S20, S21
or with X and V as follows:
X: S11, S11, S11, S11, S11, S11, S11, S11, S11, S11, S11, S11,
V: S1, S2, S3, S4, S5, S6, S7, S8, S9, S10, S11, S12,
X: S11, S11, S11, S11, S11, S11, S11, S11
V: S13, S14, S15, S16, S17, S18, S19, S20, S21
or with X and V as follows:
X: S12, S12, S12, S12, S12, S12, S12, S12, S12, S12, S12, S12,
V: S1, S2, S3, S4, S5, S6, S7, S8, S9, S10, S11, S12,
X: S12, S12, S12, S12, S12, S12, S12, S12
V: S13, S14, S15, S16, S17, S18, S19, S20, S21
or with X and V as follows:
X: S13, S13, S13, S13, S13, S13, S13, S13, S13, S13, S13, S13,
V: S1, S2, S3, S4, S5, S6, S7, S8, S9, S10, S11, S12,
X: S13, S13, S13, S13, S13, S13, S13, S13
V: S13, S14, S15, S16, S17, S18, S19, S20, S21
or with X and V as follows:
X: S14, S14, S14, S14, S14, S14, S14, S14, S14, S14, S14, S14,
V: S1, S2, S3, S4, S5, S6, S7, S8, S9, S10, S11, S12,
X: S14, S14, S14, S14, S14, S14, S14, S14
V: S13, S14, S15, S16, S17, S18, S19, S20, S21
or with X and V as follows:
X: S15, S15, S15, S15, S15, S15, S15, S15, S15, S15, 515, S15,
V: S1, S2, S3, S4, S5, S6, S7, S8, S9, S10, S11, S12,
X: S15, S15, S15, S15, S15, S15, S15, S15
V: S13, S14, S15, S16, S17, S18, S19, S20, S21
or with X and V as follows:
X: S16, S16, S16, S16, S16, S16, S16, S16, S16, S16, S16, S16,
V: S1, S2, S3, S4, S5, S6, S7, S8, S9, S10, S11, S12,
X: S16, S16, S16, S16, S16, S16, S16, S16
V: S13, S14, S15, S16, S17, S18, S19, S20, S21
or with X and V as follows:
X: S17, S17, S17, S17, S17, S17, S17, S17, S17, S17, S17, S17,
V: S1, S2, S3, S4, S5, S6, S7, S8, S9, S10, S11, S12,
X: S17, S17, S17, S17, S17, S17, S17, S17
V: S13, S14, S15, S16, S17, S18, S19, S20, S21
or with X and V as follows:
X: S18, S18, S18, S18, S18, S18, S18, S18, S18, S18, S18, S18,
V: S1, S2, S3, S4, S5, S6, S7, S8, S9, S10, S11, S12,
X: S18, S18, S18, S18, S18, S18, S18, S18
V: S13, S14, S15, S16, S17, S18, S19, S20, S21
or with X and V as follows:
X: S19, S19, S19, S19, S19, S19, S19, S19, S19, S19, S19, S19,
V: S1, S2, S3, S4, S5, S6, S7, S8, S9, S10, S11, S12,
X: S19, S19, S19, S19, S19, S19, S19, S19
V: S13, S14, S15, S16, S17, S18, S19, S20, S21
or with X and V as follows:
X: S20, S20, S20, S20, S20, S20, S20, S20, S20, S20, S20, S20,
V: S1, S2, S3, S4, S5, S6, S7, S8, S9, S10, S11, S12,
X: S20, S20, S20, S20, S20, S20, S20, S20, S21
V: S13, S14, S15, S16, S17, S18, S19, S20, S21
or with X and V as follows:
[see original]
X: S21, S21, S21, S21, S21, S21, S21, S21, S21, S21, S21, S21,
V: S1, S2, S3, S4, S5, S6, S7, S8, S9, S10, S11, S12,
X: S21, S21, S21, S21, S21, S21, S21, S21, S21
V: S13, S14, S15, S16, S17, S18, S19, S20, S21.

The invention in addition comprises the said compounds 4, 5, 5b, 5c, 8, 9, 12, 21 (where 2 residues M are equal to V and W), 22, 23, 24, 24a, 24b, 25 and 26 (for M unlike =C=Z), 27 (for M unlike =C=Z), 29, 31 when for the substituents X=V and Y=W with the concrete substitution patterns when in the tables mentioned above V is replaced by Y for these compounds and when to each one of the compounds in succession is assigned the substituent X of a first line and the substituent Y below it of the following line.

The invention in addition comprises the said compounds 4, 5, 5b, 5c, 8, 9, 12, 21 (where 2 residues M are equal to V and W), 22, 23, 24, 24a, 24b, 25, and 26 (for M unlike =C=Z), 27 (for M unlike =C=Z), 29, 31 when for the substituents X=W and Y=V with the concrete substitution patterns when to each one of the compounds following is assigned the substituent X of a first line and the substituent Y below it of the following line.

In the compounds 21, 25 and 26 both residues may here be alike or independent of one another: —S—, —O—, —NR— or =C=Z with Z=S1, S2, S3, S4, S5, S6, S7, S8, S9, S10, S11, S12, S13, S14, S15, S16, S17, S18, S19, S20 or S21.

The residues $R^1$ to $R^{32}$ may be alike or unlike and be selected from the group consisting of hydrogen, halogen, (in particular —F, —Cl), cyano, nitro, nitroso, sulfamide (unsubstituted or substituted, in particular C1–C6 mono or dialkyl substituted), carboxy, C1–C7 carbalkoxy, C1–C7 sulfo, sulfohalogen (in particular —F or —Cl), halogen carbonyl (in particular —F or —Cl), carbamoyl (unsubstituted or substituted, in particular C1–C6 N monosubstituted or alike or independently of one another N—C1–C6 disubstituted), formyl, amidineformyl, C1–C6 alkylsulfanyl, C1–C6 alkylsulfonyl, C1–C25 hydrocarbon, preferably C1–C14 hydrocarbon or C1 to C10 or C1 up to 6 hydrocarbon, where one or more or all of the carbon atoms of the group may be substituted with one or more of the above-mentioned residues, where the hydrocarbon may be saturated, unsaturated or an aromatic hydrocarbon. The hydrocarbon groups may in each instance in particular be perhalogenated, perchlorinated or perfluorinated (in particular trifluoromethyl). The hydrocarbon groups may be linear or branched or cyclic, for example cyclohexyl or cyclopentyl. One or more carbon atoms may in each instance be replaced by heteroatoms, in particular N, O, S, —(O)S(O)— or P(R). The (hetero) hydrocarbon residues may be cyclically linked with one another or with a quinoid or other ring, for example a (hetero)aryl ring.

In particular, the residues $R^1$ to $R^{32}$ may be one of the groups acetyl-, trifluoroacetyl-, benzoyl-, pentafluorobenzoyl-, naphthoyl- or alkoxycarbonyl-, where the alkyl residue may be an alkyl with one up to six or to ten, in particular up to four, C atoms linked together unbranched or branched, as well as trialkyl-phosphoryl with alkyl residues, which likewise may consist of a chain with up to five or six or eight carbon atoms linked together unbranched or branched or cyclically or triarylphosphoryl with aryl residues with preferably 6 to 14 C atoms, in particular up to 10 C atoms. In addition, the residues $R^1$–$R^{32}$, which may be alike or unlike, may be either aryl or heteroaryl, such as for example phenyl, naphthyl, anthranyl, pyridyl, quinoxalyl, pyrazoyl, oxazolyl, 1,3,2-dioxaborinyl or 1,3,4 oxdiazolyl, which may be substituted either by hydrogen or an aryl of low molecular weight with one to eight saturated carbon atoms, which may be linked together unbranched or branched or cyclically, preferably however by halogen, primarily fluorine or chlorine, trichloromethyl, perfluoroalkyl with one to six carbon atoms, in particular trifluoromethyl, but alternatively by cyano, nitro, nitroso, sulfo, carboxyl, carbalkoxy, halogen carbonyl, carbamoyl, formyl, amidineformyl, alkylsulfanyl and alkylsulfonyl, where here again the alkyl residues may consist of a chain with up to five or six or up to eight carbon atoms linked together unbranched or branched or cyclically, as well as by trialkylphosphoryl with alkyl residues, which likewise may consist of a chain with up to five or six or up to eight carbon atoms linked together unbranched or branched. In particular, the aryl or heteroaryl residues may be perhalogenated, in particular perfluorinated.

The residues $R^2$, $R^3$, $R^4$, $R^5$, $R^6$ in the compounds 3, 3b, 3c or formulas IV, V or VI may be alike or unlike for unlike n or m.

The residues $R^1$ to $R^{32}$, which are linked with a quinoid or aromatic system of a compound used according to the invention and are arranged adjacent to one another and are separated by two, three or four atoms of the quinoid or aromatic skeletal structure, may be linked together with formation of a carbocyclic, in particular aromatic ring, or heterocyclic, in particular heterocarbocyclic ring. This applies in particular to the compounds 1 to 33, but alternatively to other quinones or quinone derivatives used according to the invention. This applies for example pairwise in each instance, alternatively or simultaneously to the residues R1, R2 and/or R3, R4 of the compounds 1, 3, 3b, 7, 8, 9, 10, 11, 12, 23, 24, 25, 27, 28, the residues R1, R2; R2, R3; R4, R5 and/or R5, R6 of compound 2, the residues R1, R2; R3, R4; R5, R6; R7, R8 of compound 3, the residues R5, R6; R7, R8 of compounds 28, 29 or others. The bridging groups of atoms may in particular form a group that is selected from —$L^1$—$C(R^1)$=$C(R^2)$—$L^2$— with L=O, S, NR or $CR^{14}R^{15}$, or —C(X)C(Y)—$C(R^1)$=$C(R^2)$= or —C(=X)$C(R^3)$=$C(R^4)$—C(=Y)— or —C(=X)—L—C(=Y) with L=O, S, NR, $CR^{14}R^{15}$ with X and Y as defined above and preferably selected from the group

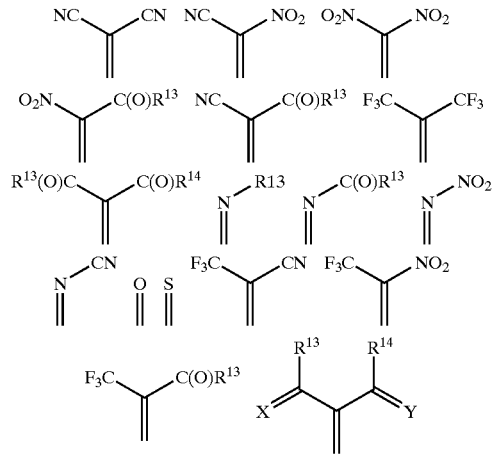

where the residues R13 of the various groups may be unlike. The bridging groups of atoms may in particular be provided when X and/or Y are =O or =S or =$C(CN)_2$. In particular, L may then be —O— or —S— or —NR—.

However, every two adjacent residues from $R^1$–$R^{32}$ may alternatively be linked together by a carboxy- —(CO)— or a carbimide group —(CNR)—, where the analogous substitution pattern applies for this R as for $R^1$–$R^{30}$. However, it is alternatively possible that two adjacent residues R are linked together by carbon atoms or heteroatoms in such a way that a new carbocyclic or heterocyclic element is fused to the respective basic cyclic skeleton. For example, in compound type 1 the residues $R^1$ and $R^2$ as well as $R^3$ and $R^4$ stand for a fused benzo or naphtho residue, but alternatively for a fused thiophene, furan, 1,3,4-oxdiazole, pyridine, pyrazine, triazine, tetrazine, pyrane, thiopyrane, dithiine, phosphorine, phthalic acid anhydride, phthalic acid imide or dithiazole residue, where these residues again may be exclusively or partially substituted by additional electron-attracting groupings, such as halogen, including preferably fluorine or chlorine, trifluoromethyl or cyano, nitro, nitroso, sulfo, carboxy, carbalkoxy, halogen carbonyl, carbamoyl, formyl, amidineformyl. The same applies, mutatis mutandis, to the residues $R^1$ and $R^2$ or $R^2$ and $R^3$ or for the residues $R^4$ and $R^5$ or $R^5$ and $R^6$ in compound type 2 as well as to the residues $R^1$ and $R^2$, $R^3$ and $R^4$, $R^5$ and $R^6$ as well as $R^7$ and $R^8$ in compound type 3, as well as to the residues $R^2$ and $R^3$ or $R^5$ and $R^6$ in the compound types 4 and 5, as well as to the corresponding pairs of residues R of the other compounds, which are close enough together to form a 5 or 6-membered ring.

The bridged trans-diketo form of compound 8 may for example result in the structures 28 or 29. In the formula 26 the carboxylic acid anhydride acid may alternatively be replaced by a substituted nitrogen group $=N-R^1$ and hence form a carboxylic acid imide structure.

The aromatic residues, with which the quinoid systems may be substituted and/or anellated, may be perhalogenated, in particular perfluorinated, perchlorinated or perfluorochlorinated. Optionally a number, for example up to one-half or more, of the halogen atoms may be replaced by hydrogen. The same may also alternatively or simultaneously apply to the residues R of the quinoid systems. Instead of halogen atoms, CN groups may alternatively be provided on the aromatic residues and/or the quinoid systems.

Two quinoid systems. Ch1 and Ch2 may in each instance be linked together with formation of a compound Ch1-ZB-Ch2 by a residue ZB, where the quinoid residues Ch1 and Ch2 may be linked together mesomerically or be mesomerically independent of one another. The quinoid residues Ch1 and Ch2 may be alike or unlike and may be selected from the group of compounds 1 to 4 and 5 to 33, while optionally additional quinoid systems may alternatively be linked together, for example with formation of structures such as Ch1-ZB1-Ch2-ZB2-Ch3, where Ch1, Ch2, Ch3 may be alike or unlike and may in each instance represent the compounds 1 to 4 and 5 to 33, without being limited thereto. ZB1 and ZB2 may be alike or unlike.

The bridges —Z— may have 1, 2 to 4, up to 6 or up to 10 or alternatively more bridge atoms, which may be carbon atoms or at least in part heteroatoms.

When two quinoid compounds, as in formulas 5, 5b or 5c, are linked together by a residue Z, this bridge —Z— may consist of alkenylene, haloalkenylene, acetylene, alkylene, haloalkylene, in particular perfluoroalkylene with one to eight saturated carbon atoms, which may be linked together unbranched or branched, or of arylene, hetarylene, which may be substituted either with hydrogen or with alkyl residues of low molecular weight with one to six or up to eight saturated carbon atoms, which may be linked together unbranched or branched or cyclically, preferably however with halogen, primarily fluorine or chlorine, trichloromethyl, perfluoroalkyl with one to six carbon atoms, there in particular trifluoromethyl, but alternatively cyano, nitro, nitroso, sulfo, carboxy, carbalkoxy, halocarbonyl, carbamoyl, formyl, amidineformyl, alkylsulfanyl and alkylsulfonyl, where the alkyl residues here again may consist of a chain with up to eight carbon atoms linked together unbranched or branched or cyclically, as well as trialkylphosphoryl with alkyl residues, which likewise consist of a chain with up to eight carbon atoms linked together unbranched or branched, may be substituted. The alkenylene group and the alkylene group may have one or more multiple C—C bonds. The bridge atoms of group Z may consist only of unsaturated carbon atoms or heteroatoms, where the said groups may be unsubstituted or substituted. The bridge atoms of group Z may consist only of saturated or aromatic carbon or heteroatoms, while the said groups may be unsubstituted or substituted, so that the two quinoid systems may be mesomerically linked together.

The bridge —Z— may comprise one or more groups, in particular the groups below in the form —(Z)n—, for example with n equal to 1, 2, 3 or 4 or more, which in each instance may be alike or unlike one another.

Z may be selected from the group consisting of

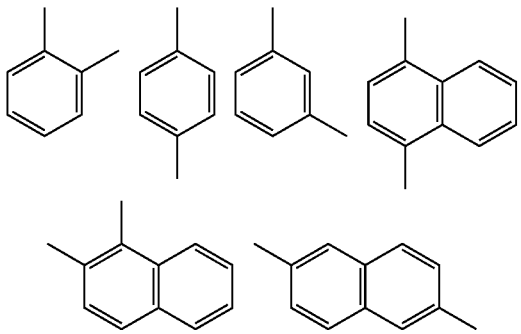

and/or selected from the group consisting of

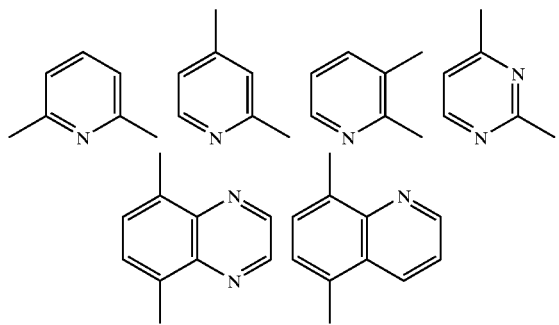

and/or selected from the group consisting of

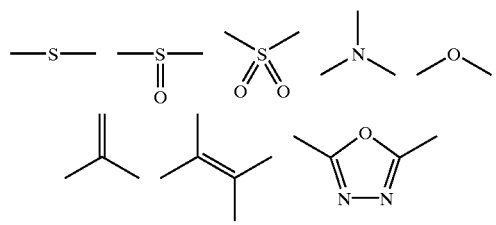

where the bridges indicated alternatively include substituted bridges such as for example —NR—, —(C=X)—, —CR1=CR2—, and/or selected from the group consisting of carboxy- —(CO)—, carbimide- —(CNR)—, thiophenylene-, furanylene-1,3,4-oxdiazolylene-, triazine-, tetrazinylene-, pyranylene-, thiopyranylene-, dithiinylene-, phosphorinylene-, phthalic acid anhydride, phthalic acid imide and dithiazole residues.

The aromatic rings or carbon or heterobridges indicated may in each instance be substituted or unsubstituted. X may be a singly or doubly substituted carbon atom, a singly substituted nitrogen atom or =O or =S, preferably selected from one of the groups or subgroups listed above.

The residues $R^1$ and $R^2$ may be unlike the residues $R^1$ and $R^2$ of the basic structures of compounds 1 to 33.

In addition, it is possible for the two quinoid structures to be linked together directly in any way.

Preparation of quinoid structures

All syntheses of quinoid compounds described below are hereby fully included in the present invention by reference thereto and are covered by it.

The corresponding substitution patterns are frequently produced in the product to be oxidized. 1,4-quinones may best be prepared by oxidation of the corresponding hydroquinone (W. T. Sumerford, D. N. Dalton, J. Am. Chem. Soc. 1944, 66, 1330; J. Miller, C. Vasquez, 1991 U.S. Pat. No. 506,836; K. Koch, J. Vitz, J. Prakt. Chem. 2000, 342/8 825–7) or the fluorinated and/or chlorinated aromatic compounds (A. Roedig et al. Chem. B. 1974, 107, 558–65; O. I. Osina, V. D. Steingarz, Zh. Org. Chem. 1974, 10, 329; V. D. Steingarz et al. Zh. Org. Chim. 1970, 614, 833). 1,3-indanedione compounds have been synthesized by V. Khodorkovsky et al. (V. Khodorkovsky et al. Tetrahedron Lett. 1999, 40, 4851–4).

N,N'-dicyano-1,4-quinonediimines are accessible either by the action of N,N'-bistrimethylsilylcarbodiimide on 1,4-quinone compounds (A. Aumüller, S. Hünig, Liebigs Ann. Chem., 1986, 142–64) or by oxidation of appropriate N,N'-dicyano-1,4-diamine compounds (G. D. Adreetti, S. Bradamante, P. C. Pizzarri, G. A. Pagani, Mol. Cryst. Liq. Cryst. 1985, 120, 309–14), where the N,N'-dicyano-1,4-diamine compounds may be obtained by cyanization of phenylene-1,4-diamine with cyanohalogenides or by desulfurization of corresponding thiourea derivatives.

Simple tetracyanoquinone dimethanes may be prepared via 1,4-cyclo-hexanedione by condensation in benzene with ammonium acetate buffer on the water separator and subsequent oxidation by bromine (D. S. Acker, W. R. Hertler, J. Am. Chem. Soc. 1962, 84, 3370). In addition, Hertler and co-workers showed that these compounds are capable of being synthesized via 1,4-xylene and its analogs by side-chain bromination, substitution by means of cyanide, condensation with carbonic diethyl ester, conversion of the carboxylic acid methyl ester groupings to cyanide groups and then oxidation (J. Org. Chem. 1963, 28, 2719).

Acceptor-substituted tetracyanoquinonedimethanes may be prepared from the sodium salt of t-butyl-malonic acid dinitrile and acceptor-substituted 1,4-dihalogen aromatic compounds (R. C. Wheland, E. L. Martin, J. Org. Chem., 1975, 40, 3101).

In addition, tetracyanoquinonedimethanes have been prepared from 1,4-dihalogen aromatic compounds Pd-catalyzed with malodinitrile anion and subsequent oxidation (S. Takahashi et al., Tetrahedron Letters, 1985, 26,1553).

Chinoide 1,4-polyphenylene E. A. Shalom, J. Y. Becker, I, Agranat, Nouveau Journal de Chimie 1979, 3, 643–5.

Heteroanellated quinones have been prepared by the multiple-step synthesis pathway. (B. Skibo et al., J. Med. 1991, 34, 2954–61; H. Bock, P. Dickmann, H. F. Herrmann, Z. Naturforsch. 1991, 46b, 326–8, J. Druey, P. Schmidt, Helv. Chim. Acta 1950, 140, 1080–7).

Bridged quinoid compounds have been prepared by M. Matstoka, H. Oka, T. Kitao, Chemistry Letters, 1990, 2061–4; J. Dieckmann, W. R. Hertler, R. E. Benson, J. A. C. S. 1963, 28, 2719–24; K. Takahashi, S. Tarutani, J. C. S. Chem. Comm. 1994, 519–20; N. N. Woroschzov, W. A. Barchasch, Doklady Akad. SSSR 1966,166/3, 598.

Anellated TCNQ compounds have been prepared by M. Matsuoka, H. Oka, T. Kitao, Chemistry Letters, 1990, 2061–4; B. S. Ong, B. Koeshkerian, J. Org. Chem. 1984, 495002–3.

Pyrazino-TCNQ compounds may be prepared via 5,8-diiodoquinoxalines palladium-catalyzed with the sodium salt of malodi medium. (T. Miyashi et al., J. Org. Chem. 1992, 57, 6749–55).

Pyrazino-TCNQ compounds as well as other heteroanellated derivatives may be prepared in a variety of ways (Y. Yamashita et al., Chemistry Letters, 1986, 715–8, F. Wudl et al., J. Org. Chem. 1977, 421666–7). Anellated DCNQI compounds may be synthesized via the corresponding quinones according to Hünig (J. Tsunetsuga et al., Chemistry Letters, 2002, 1004–5).

Heteroanellated DCNQI compounds may be synthesized via the corresponding quinones according to Hünig (T. Suzuki et al., J. Org. Chem. 2001, 66, 216–24; N. Martin et al., J. Org. Chem. 1996, 61, 3041–54; K. Kobayashy et al., Chemistry Letters, 1991, 1033-6; K. Kobayashy, K. Takahashi, J. Org. Chem. 2000, 65, 2577–9).

Heterocyclic quinoid derivatives may be prepared according to N. F. Haley, J. C. S. Chem. Comm. 1979, 1031, F. Weyland, K. Henkel Chem. B. 1943, 76, 818; H. J. Knackmuss, Angew. Chem. 1973, 85, 16; K. Fickentscher, Chem. B. 1969, 102, 2378–83, D. E. Burton et al., J. Chem. Soc. (C) 1968, 1268–73.

Quinoid structures with unlike residues X, Y have been synthesized by a variety of working groups (T. Itoh, N. Tanaka, S. Iwatsuki, Macromolecules 1995, 28, 421–4; J. A. Hyatt, J. Org. Chem. 1983, 48 129–31; M. R. Bryce et al., J. Org. Chem. 1992, 57, 1690–6; A. Schönberg, E. Singer, Chem. Ber. 1970, 103, 3871–4; S. Iwatsuki, T. Itoh, H. Itoh, Chemistry Letters, 1988, 1187–90; T. Itoh, K. Fujikawa, M. Kubo, J. Org. Chem. 1996, 61, 8329–31; S. Iwatsuki, T. Itoh, T. Sato, T. Higuchi, Macromolecules, 1987, 20, 2651–4; T. Itoh et al., Macromolecule2000, 33, 269–77; B. S. Ong, B. Koeshkerian, J. Org. Chem. 1984, 495002-3; H. Junek, H. Hamböck, B. Hornischer, Mh. Chem. 1967, 98, 315–23; P. W. Pastors et al., Doklady Akad. SSSR 1972, 204, 874–5; A. R. Katritzky et al., Heterocyclic Chem. 1989, 26, 1541–5; N. N. Vorozhtsov, V. A. Barkash, S. A. Anichkina, Doklady Akad. SSSR 1966, 166, 598).

Tetracetylquinonemethane compounds and their reduced forms may be obtained via 1,4-benzoquinone and acetylacetone (J. Jenik, Chemicky prumysl 1985 35/60 1547, R. J. Wikholm, J. Org. Chem. 1985, 50, 382–4; E. Bernatek, S. Ramstad, Acta Chem. Scand. 1953, 7,1351–6).

Ditrifluoroacetamides may be prepared by means of trifluoroacetic acid via aromatic 1,4-diamines (R. Adams, J. M. Stewart, J. A. C. S. 1952, 20, 3660–4). The diime may be obtained by oxidation with Pb(IV)-acetate.

Additional diimide and amide structures have been prepared by B. C. McKusick et al., J. A. C. S. 1958, 80, 2806–15.

EXAMPLE 1

N,N'-Dicyano-2,5-dichloro-1,4-benzoquinonediimine

Suspend 3 units N,N'-dicyano-2,5-dichlorobenzene-1,4-diimine in 200 units glacial acetic acid with stirring at 20° C., add 13 units lead-(IV)-tetraacetate. Stir until all of the starting material is oxidized. Suction off the precipitated yellow/brown product and recrystallize in benzene. Yield: 64%, m.p.: 225° C.

EXAMPLE 2

N,N'-Dicyano-2,3,5,6-tetrafluoro-1,4-benzoquinonediimine 1.5 units 2,3,5,6-tetrafluoro-1,4-benzoquinone are reacted with 7.6 units titanium tetrachloride in 70 units methylene dichloride. The yellow complex formed is brought to reaction with 7.5 units bis-(trimethylsilyl)-carbodiimide in 15 units methylene dichloride with stirring at room temperature and after 4 h is placed on ice. The aqueous phase is extracted twice with methylene dichloride. The combined organic phases are dried with magnesium chloride, filtered, concentrated to small volume under vacuum and precipitated with petroleum ether and suctioned off anew. The solid obtained is recrystallized in a mixture of toluene/methylcyclohexane. Yield: 48%, m.p.: 205° C.

1.3.2-Dioxaborines

In addition, according to the invention, 1,3,2-dioxaborine compounds may be used for doping semiconducting organic materials.

The 1,3,2-dioxaboine compounds used according to the invention may have the general formula L Formula L

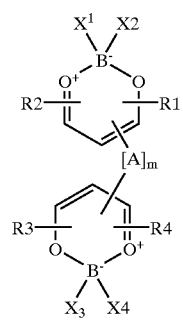

wherein A is a bivalent residue, which may have one or more carbon atoms, which may be partially or completely replaced by heteroatoms, where m=0 or is a whole number greater than 0, for example 1, 2, 3, 4, 5, 6 or greater, for example up to 10 or up to 20, and where X is a monodentate ligand, or two ligands X together may form a bidentate ligand. Here the bridge $A_m$ may have up up to 6, up to 10 or up to 20 bridge atoms, which link the two 1,3,2-dioxaborine rings together, while the bridge atoms may in particular be carbon atoms and/or heteroatoms.

The 1,3,2-dioxaborine compound/s used according to the invention may have the general formula L1

Formula L1

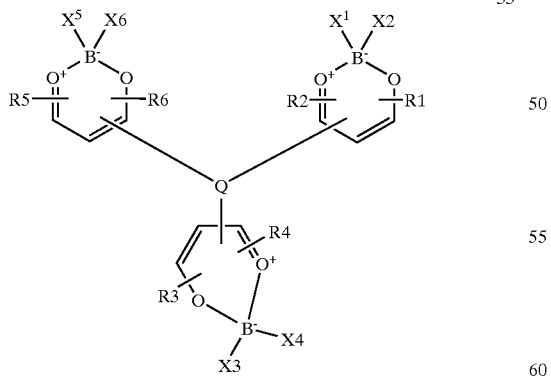

where Q is a trivalent residue and where X is a monodentate ligand or where two ligands X together form a bidentate ligand.

In addition, the 1,3,2-dioxaborine compounds used according to the invention may have the general formula LII Formula LII

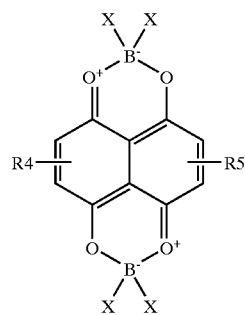

which represents a sub-case of the formula L with m=0, where the two 1,3,2-dioxaborines however are linked together mesomerically.

In particular, the 1,3,2-dioxaborines proposed here as dopants may have the general formulas 30–33

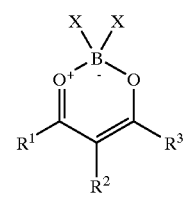

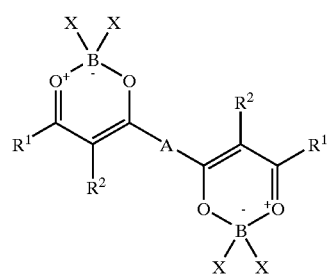

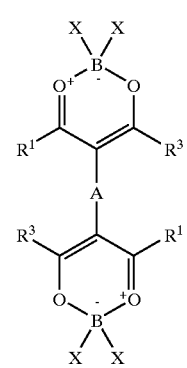

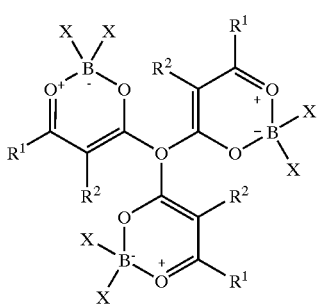

33 where in the formulas the various X and/or R1 to R3 may in each instance be alike or unlike one another.

The symbols indicated signify the following:

the residues X, a monodentate ligand with a preferably electronegative trapped atom, such as for example fluorine, alkoxy, acyloxy, aryloxy or aroyloxy, a bidentate ligand whose trapped atoms preferably represent oxygen, which via a bridge are linked together with unlike groupings of atoms and a variable number of bridge atoms, while preferably a 5 or 6-membered ring is produced by the bridge, at least one atom or all atoms of the bridge preferably being a carbon atom, the residues $R^1$–$R^6$, which in each instance may be independent of one another, either hydrogen, a hydrocarbon group, which optionally may have one or more heteroatoms, in particular an alkyl or cycloalkyl group, which advantageously may be substituted partially or completely by fluorine or chlorine, in particular perhalogenated, especially preferably perfluorinated, and preferably consists of one to six or eight or ten carbon atoms (preferably a maximum of ten carbon atoms), which are linked together either branched or unbranched, an unsubstituted or substituted aryl group Ar, including a heteroaryl group, which likewise may advantageously be substituted by halogen, in particular fluorine or chlorine, in particular perhalogenated, in particular perfluorinated, but alternatively together, in adjacent position to the 1,3,2-doxaborine skeleton with the carbon atoms linking them, may form an aromatic, heteroaromatic or nonaromatic molecular fragment, such as for example a benzo-, naphtho-, anthraceno-, thieno-, furano-, benzothiopheno-, benzofurano-, indolo-, carbazolo, quinolino-, tetrahydronaphtho- or tetrahydroquinolino- fragment, where these fragments may however yet in very flexible fashion be substituted by for example halogens, such as fluorine or chlorine, as well as by other heteroatom-containing groupings, such as alkyoxy, aryloxy, dialkylamino or diarylamino groupings, the grouping A, either a bond between the 1,3,2-dioxaborine residues or alternatively a bridge with preferably up to ten atoms, where the bridge may have carbon atoms or alternatively heteroatoms such as for example O, N, S or P, and where the carbon atoms may be replaced partially or completely by heteroatoms. The bridge may optionally have a plurality of or exclusively unsaturated bridge atoms. The bridge preferably represents, like Q, a molecular fragment mediating conjugation between the 1,3,2-dioxaborine residues, for example in that all atoms of the bridge are unsaturated, the grouping Q, either a trivalent residue such as a nitrogen or phosphorus atom, a trialkylene- or triarylene and triheteroaryleneamido- or phosphorus group. The bridge before Q preferably represents a molecular fragment mediating conjugation between the 1,3,2-dioxaborine residues.

If the residues X in the compounds of formulas L, LI or LII, in particular in compounds of formula types 30–33, represent a bidentate ligand, they are preferably the residues of organic dicarboxylic acids, such as in particular oxalic acid or malonic acid, succinic acid and glutaric acid, where these dicarboxylic acids, with the exception of the compounds first mentioned, may however be substituted in their alkylene groupings by alkyl or aryl groupings, the residues of aromatic dicarboxylic acids, such as phthalic acid and its derivatives preferably substituted in the ring by halogen, organic hydroxy acids, such as salicylic acid and its ring-substituted derivatives, 1-hydroxy-naphthaline-2-carboxylic acid, 2-hydroxy-naphthaline-1-carboxylic acid, mandelic acid, tartaric acid, benzylic acid and its derivatives substituted in phenyl residues with 1,2-dioxyarene or dioxyhetarene residues, which are derived from catechol and its derivatives substituted in the ring or fused by benzo residues, but alternatively from 3,4-dioxythiophenenes, or residues of cyclic oxodicarboxylic acids, such as quadratic, croconic acid or the like.

The groupings A and Q, whose task preferably is the production of conjugation between the individual 1,3,2-dioxaborine residues linking them, may have a great multiplicity of structures and preferably represent a bivalent or trivalent grouping of atoms, such as oxygen, sulfur or nitrogen or a plurality of bivalent or trivalent aryl grouping (s) linked together in conjugative fashion, heteroaryl groupings(s), polyenyl or polymethinyl grouping(s), where the respective groupings may however bear additional substituents, which in particular may be alkyl groups with 1 to 10 carbon atoms, which in addition however may be substituted by fluorine or chlorine, in particular perhalogenated or perfluorinated, unsubstituted or preferably may be aryl or heteroaryl groupings modified by fluorine or chlorine as well as by electron-attracting substituents, where the heteroatoms in the last preferably are oxygen, sulfur or nitrogen and may occur individually as well as alternatively in combination with one another, or else alternatively may be incorporated in suitable bridge groupings, such as cycloalkylene groupings or their heterocyclic analogs.

If A or Q symbolizes an aryl grouping, in the case of A the latter advantageously is one or more of the groupings 34–36 and in the case of Q one or optionally alternatively a plurality of the groupings 37–39, where these may be substituted by customary substituents, which preferably bear electronegative trapped atoms, and in the fragments of type 36 the residues $R^5$ and $R^6$, which may be alike or unlike, may be either hydrogen, alkyl or fluorine as well as chlorine, but preferably alternatively may on the whole be a carbon atom substituted by n-, iso- or cycloalkyl groups with 1–10 C atoms, where in compound 35 or 39 n preferably may be a whole number between 1 and 4. W may be a trivalent group or a trivalent atom such as in particular N or P or the group 42, without being limited thereto.

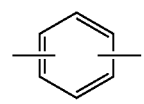

34

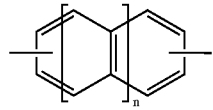

35

-continued

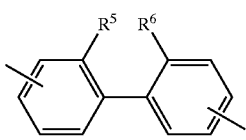
36

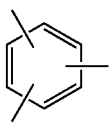
37

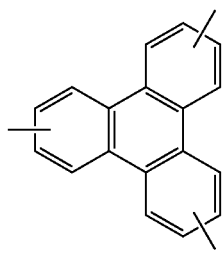
38

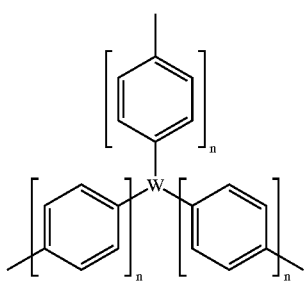
39

-continued

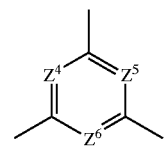
42

The compounds according to the invention of types 30–33 also include those in which the aforesaid bridge groupings may alternatively be found in combination with one another, such as is the case for example for an oxybiphenylene or thiophenylene unit as well as an aminotriphenylene unit, where linkage with the respective 1,3,2-dioxaborine system in any desired position to the heteroatom, preferably however in 1,4-linkage, is possible. The compounds according to the invention likewise include those in which, in addition to the said bridge groupings A and Q, however, one of the residues trapped in the 1,3,2- dioxaborine system is drawn into the respective bridge grouping, so that compounds of the general formulas 43–46 are produced, in which the groupings X and $R^1$–$R^3$ have the meanings indicated above and $R^4$ has the meaning corresponding to the residues $R^1$–$R^3$.

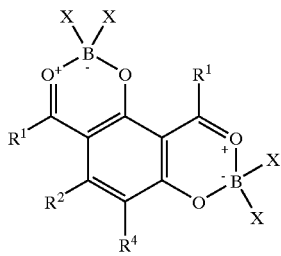
43

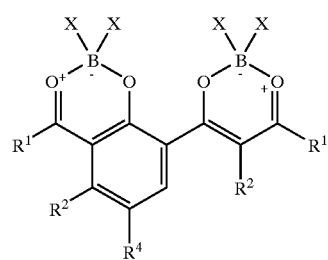
44

If A or Q symbolizes a hetaryl group, in the case of A this preferably represents a grouping of the general formula 40 or 41, where optionally in the group A introductions according to formulas 40 and 41 may alternatively occur combined, and in the case of Q a grouping of the general formula 42, in which the residues $R^7$ and $R^8$ may be any desired substituents, such as for example alkyl, aryl or heteroaryl as well as halogen or alkoxy, aryloxy, dialkylamino or diarylamino, and the groupings $Z^1$–$Z^6$ may be bivalent heteroatoms, such as preferably oxygen, sulfur or unsubstituted or substituted nitrogen or phosphorus, and n may be a whole number, preferably between 1 and 4 or 6, in particular 1, 2 or 3.

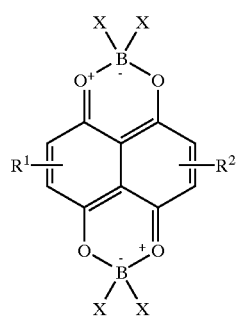
45

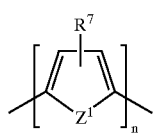
40

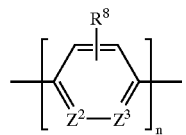
41

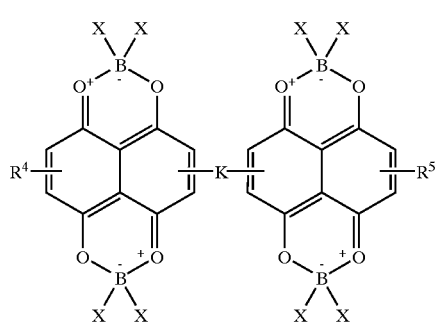

46

The symbol K stands for a grouping that links the two flanking 1,3,2-dioxaborine-containing molecular structures, preferably links them together conjugatively, which for example is possible by direct fusion of the two flanking groupings or with incorporation of an aryl or hetaryl fragment.

The following compounds illustrate, in exemplary fashion, the 1,3,2-dioxaborines usable according to the invention.

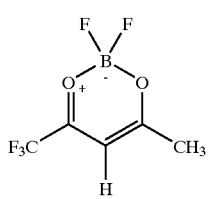

30a

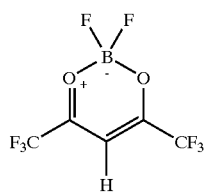

30b

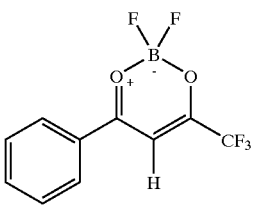

30c

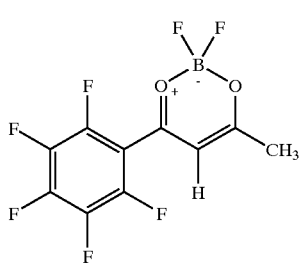

30d

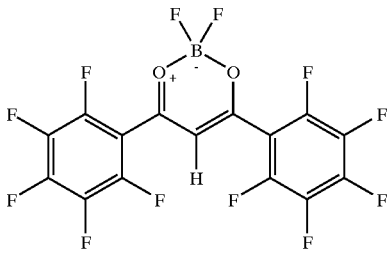

30f

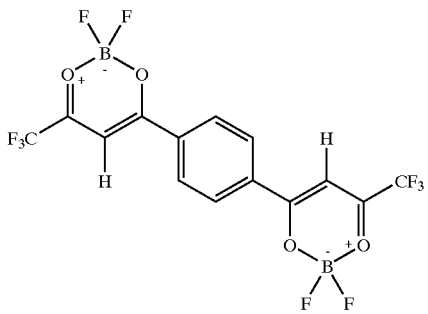

30g

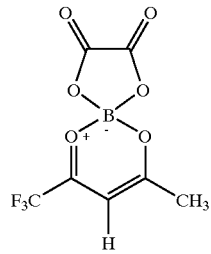

30h

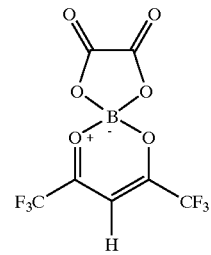

30i

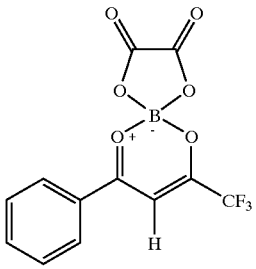

30j

30k
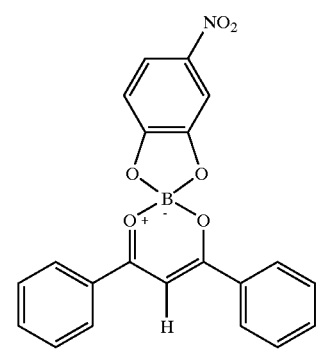
30l
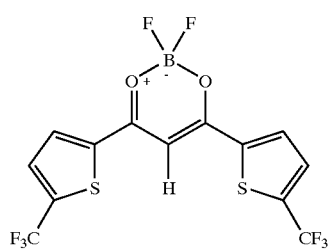
30m
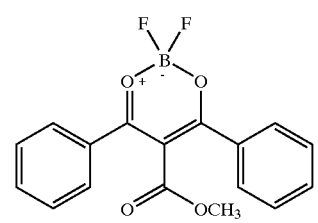
30n
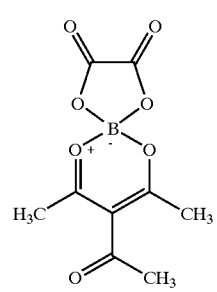
31a
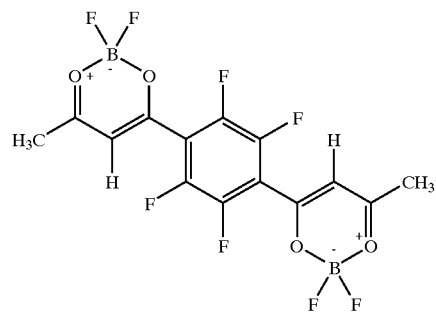
31b
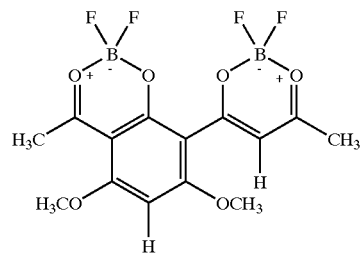
31c
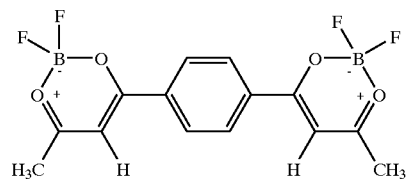
31d
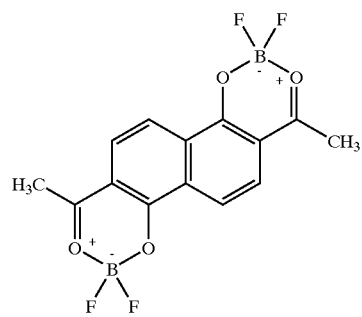
31e
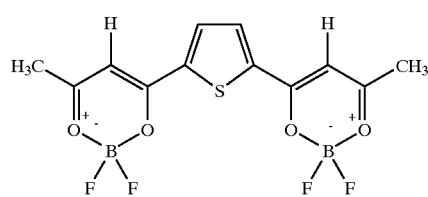
31f
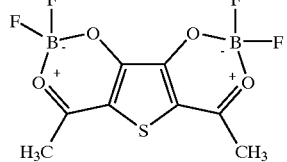
31g
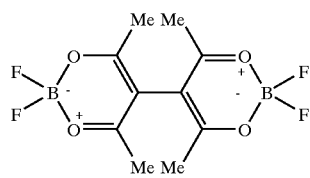
31h
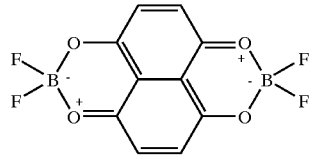

31i
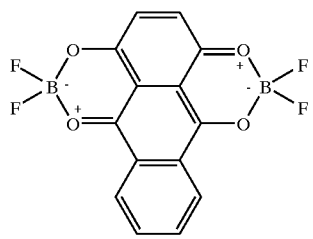
31j
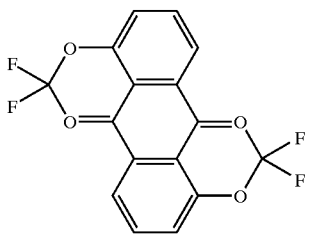
31k
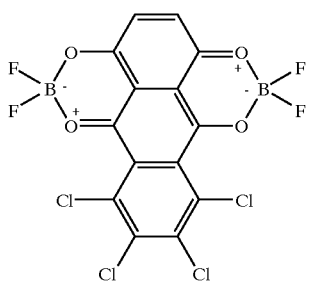
31l
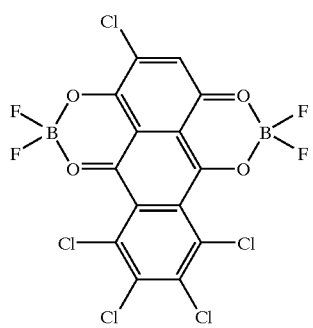
31m
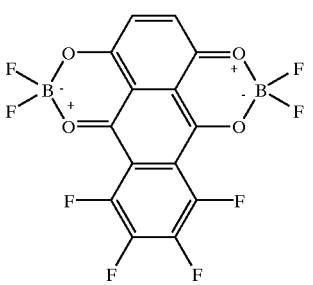
31n
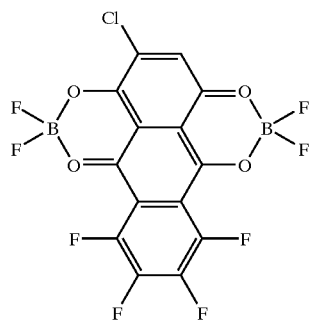
32a
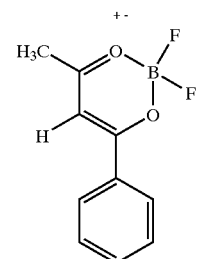
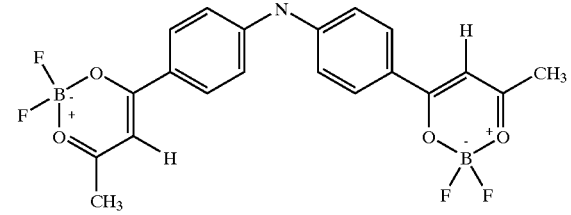
32b
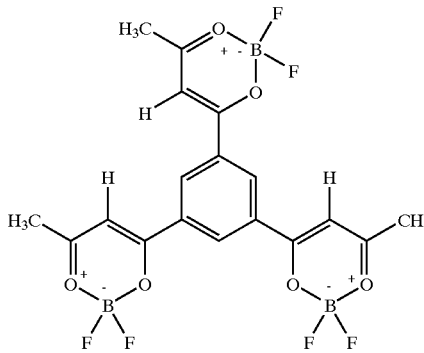
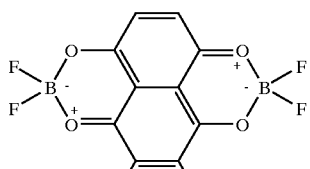
31c
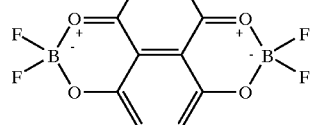

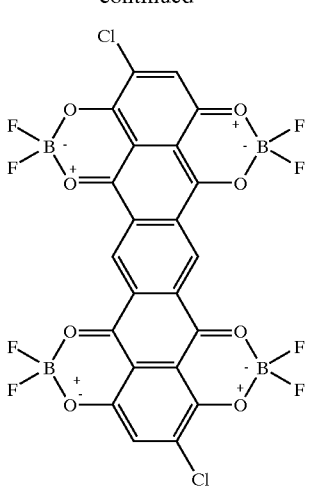

31p

The compounds 31f to i represent compounds of formula type L with m=0.

The compounds 30g, 31a to e and 31j represent compounds of formula type L with m=1, where in the case of compound 31 b A is —C(=CR1 R2)— and m is equal to 1, while in the case of compounds 31d and j A is —CR1=CR2— and m is equal to 1.

Compounds 32a and b represent compounds of formula type L1.

Compounds 31 k to n and o, p represent compounds of formula type LII.

Preparation of 1.3.2-dioxaborines 1,4-Bis-(2,2-difluoro-4-methyl-1,3, 2-dioxaborinyl)-benzole:

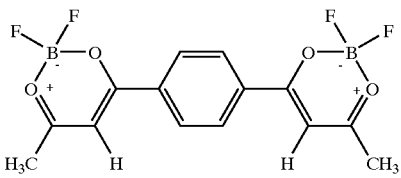

To a solution of 1,4-diacetylbenzole (0.01 mol) in acetic hydride (50 mL) boron trifluoride etherate (10 mL) is added by drops, at room temperature while stirring. After standing overnight the precipitated solid is suctioned off and washed with ether. M. 293–298° C.

5,7-Bismethoxy-2,2-difluoro-4-methyl-8-(2,2-difluoro-4-methyl-1,3,2-dioxaborinyl)-benzo[d]1,3,2dioxaborine:

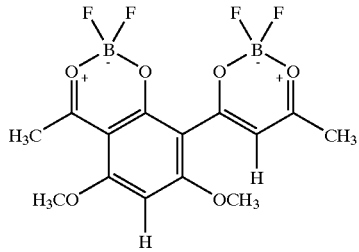

To a solution of 1,3,5-trimethoxybenzole (0.1 mol) in acetic anhydride (0.9 mol) bortrifluoride/acetic acid (0.3 mol) is added by drops at room temperature with stirring. After standing overnight the precipitated solid is suctioned off, washed with ether and recrystallized in toluene/nitromethane. M. 217–219° C.

2,2,7,7-Tetrafluoro-2,7-dihydro-1,3,6,8-doxa-2,7-diborapyrene:

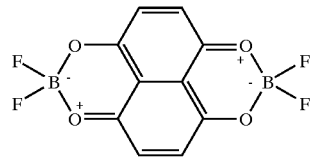

1 g 5,8-dihydroxy-1,4-naphthoquinone and 1.5 ml BF₃ etherate were heated in dry toluene for 2 h on a water bath while stirring. After cooling to room temperature a red-brown crystalline precipitate was deposited, which may be recrystallized in dry glacial acetic acid. M. 163-165° C.

2,2,7,7-Tetrafluouro-2,7-dihydro-1,3,6,8-doxa-2,7-dibora-benzo[e]pyrene:

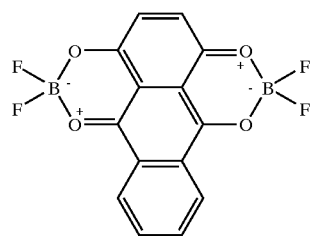

10 g quinizarine and 10 mL BF₃ etherate were heated in dry toluene for 2 h on the water bath with stirring. After cooling to room temperature a red-brown crystalline precipitate is deposited, which may be recrystallized in dry glacial acetic acid. M. 249–251° C.

2,2,8,8-Tetrafluoro-2,8-dihydro-1,3,7,9-tetraoxa-2,8-diboraperylene:

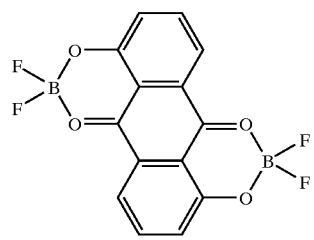

10 g 1,5-dihydroxy-9,10-anthraquinone and 10 mL BF₃ etherate were heated in dry toluene for 2 h on the water bath with stirring. After cooling to room temperature a red crystalline precipitate is deposited, which may be recrystallized in dry glacial acetic acid. M. >350° C.

Tris-[4-(2,2-difluoro-4-methyl-1,3,2-dioxaborinyl)-phenylamine:

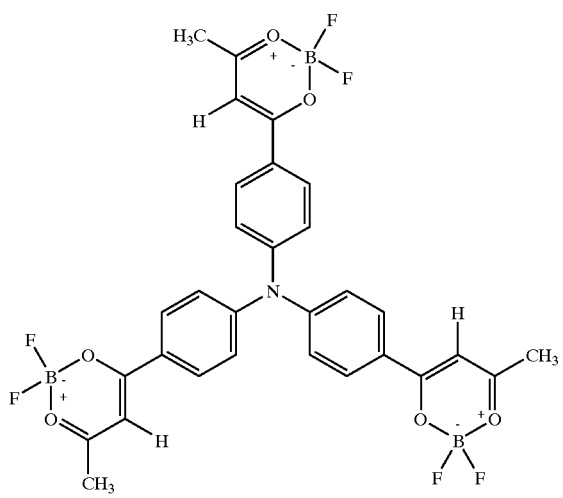

To a solution of triphenylamine (0.1 mol) in acetic anhydride (0.9 mol) bortrifluoride/acetic acid (0.3 mol) is added by drops at room temperature with stirring. After standing overnight the precipitated solid is suctioned off, washed with ether and recrystallized in glacial acetic acid/nitromethane. M. 305–307° C.

1,3,5-Tris(2,2-difluoro-4-methyl-1,3,2-dioxaborinyl)-benzole:

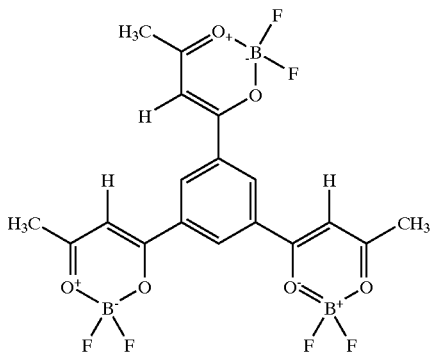

To a mixture of acetic anhydride (0.6 mol) and bortrifluoride-acetic acid (0.2 mol.) 1,3,5-triacetylbenole (0.05 mol) was slowly added by drops, while stirring at 45° C. The resulting mixture is stirred for another 8 hrs and then allowed to cool. The product precipitated after addition of diethylether (100 mL) is suctioned off, washed with ethyl acetate and recrystallized in nitromethane. M. >360° C.

7,9-Dimethyl-1,4,6,10-tetraoxa-5-bora-spiro[4,5]deca-7,9-diene-2,3-dione:

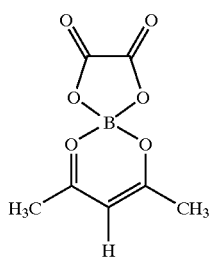

Acetylacetone (0.1 mol), oxalic acid (0.1 mol) and boric acid (0.1 mol) are heated in toluene (200 mL) until a clear solution is produced and no more water is separated. After cooling, the precipitated product is suctioned off and washed with cyclohexane. M. 187–189°.

8-Acetyl-7,9-dimethyl-1,4,6,10-tetraoxa-5-bora-spiro[4,5]deca-7,9-diene-2,3-dione:

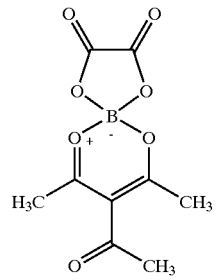

Triacetylmethane (0.1 mol) and bortrifluoride etherate (0.15 mol) are stirred in ether (200 mL) for 20 hrs at room temperature. Then the precipitated product is suctioned off and washed with cyclohexane. M. >250° C.

2,3-Benzo-7,9-bis-(4-chlorophenyl)-1,4,6,10-tetraoxa-5-bora-spiro[4,5]deca-7,9-diene:

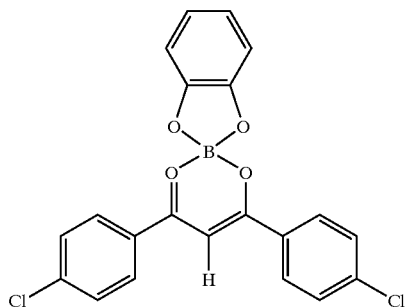

Pyrocatechol (0.1 mol), bis-(4-chlorobenzoyl)-methane (0.1 mol), and boric acid (0.1 mol) are heated in toluene (250 mL) until a clear solution is obtained and no more water is separated. After cooling the precipitated product is suctioned off and washed with cyclohexane. M. 312–315° C.

Matrix materials

Suitable dopants for organic semiconducting materials such as hole-transport materials HT, which customarily are used in OLEDs or organic solar cells, are described in the present invention. The semiconducting materials preferably are intrinsically hole-conducting. The following may apply for dopants of the quinone type as well as of the dioxaborine type.

The matrix material may consist partially (>10 or >25 wt. %) or substantially (>50 wt. % or >75 wt. %) or completely of a metal phthalocyanine complex, a porphyrin complex, in particular metal porphyrin complex, an oligothiophene, oligophenyl, oligophenylenevinylene or oligofluorene compound, where the oligomer preferably comprises 2–500 or more, preferably 2–100 or 2–50 or 2–10 monomer units. Optionally, the oligomer may alternatively comprise >4, >6 or >10 or more monomer units, in particular alternatively for the regions indicated above, i.e. for example 4 or 6–10 monomer units, 6 or 10–100 monomer units or 10–500 monomer units. The monomers and oligomers may be substituted or unsubstituted, where alternatively block or mixed polymers in the said oligomers of a compound with a triarylamine unit or a spiro-bifluoro compound may be present. The said matrix materials may alternatively be present in combination with one another, optionally alternatively in combination with other matrix materials. The matrix materials may have electron-shifting substituents such as alkyl or alkoxy residues, which have reduced ionization energy or which reduce the ionization energy of the matrix material.

The metal phthalocyanine complexes or porphyrin complexes used as matrix materials may have a main group metal atom or a metal atom of the B group. The metal atom Me may in each instance be coordinated 4, 5 or 6 times, for example in the form of oxo (Me=O), dioxo (O=Me=O), imine, diimine, hydroxo, dihydroxo, amino or diamino complexes, without being limited thereto. The phthalocyanine complex or porphyrin complex may in each instance be partially hydrated, where however the mesomeric ring system preferably is not disturbed. The phthalocyanine complexes may contain as central atom for example magnesium, zinc, iron, nickel, cobalt, magnesium, copper or vanadyl (=VO). The same or other metal atoms and oxometal atoms may be present in the case of porphyrin complexes.

In particular, such dopable hole-transport materials HT may be arylated benzidines, for example N,N'-perarylated benzidines or other diamines such as types TFD (where one, more or all of the aryl groups may have aromatic heteroatoms), suitable arylated starburst compounds such as N,N',N'-perarylated starburst compounds, such as the compound TDATA (where one, more or all of the aryl groups may have aromatic heteroatoms). The aryl residues may in particular comprise, for each of the compounds mentioned above, phenyl, naphthyl, pyridine, quinoline, isoquinoline, peridazine, pyrimidine, pyrazine, pyrazole, imidazole, oxazol, furan, pyrrole, indole or the like. The phenyl groups of the respective compounds may be partially or completely replaced by thiophene groups.

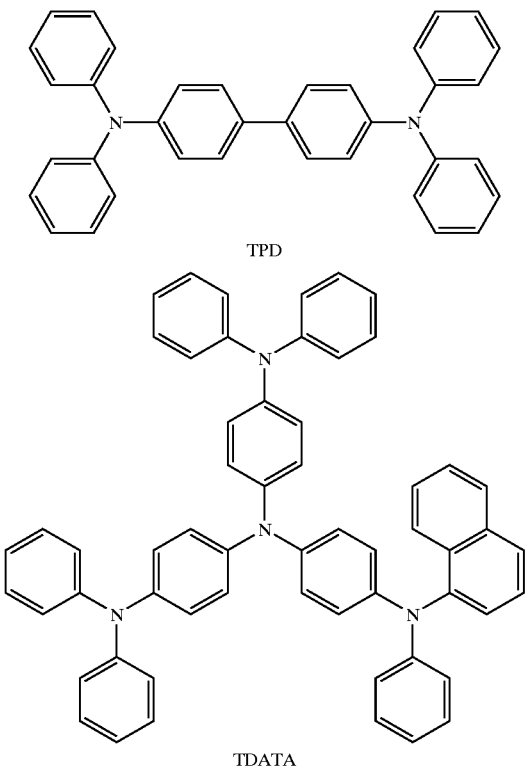

TPD

TDATA

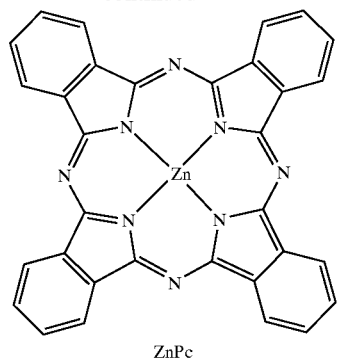

ZnPc

Preferably, the matrix material used consists completely of a metal phthalocyanine complex, a porphyrin complex, a compound having a triarylamine unit or a spiro-bifluorene compound.

It is understood that other suitable organic matrix materials that have semiconducting properties, in particular hole-conducting materials, may be used.

Doping

Doping may in particular take place in such a way that the molar ratio of matrix molecule to dopant, or in the case of oligomeric matrix materials, the ratio of the number of matrix monomers to dopant is 1:100000, preferably 1:1 to 1:10000, especially preferably 1:5 to 1:1000, for example 1:10 to 1:100, for example about 1:50 to 1:100 or alternatively 1:25 to 1:50.

Evaporation of dopants

Doping of the respective matrix material (here preferably indicated as hole-conducting matrix material HT) with the dopants to be used according to the invention may be produced by one or a combination of the following methods:
a) mixed evaporation under vacuum with one source for HT and one for the dopant
b) sequential deposition of HT and dopant with subsequent in-diffusion of the dopant by heat treatment
c) doping of a HT layer by a solution of dopant with subsequent evaporation of the solvent by heat treatment
d) superficial doping of a HT layer by a layer of dopant applied to the surface.

Doping may be effected in such a way that the dopant is evaporated in a precursor compound that releases the dopant upon heating and/or irradiation. Irradiation may be effected by means of electromagnetic radiation, in particular visible light, UV light or IR light, for example laser light in each instance, or alternatively by other types of radiation. The heat required for evaporation may be substantially provided by irradiation, alternatively the compounds or precursors or compound complexes such as charge-transfer complexes to be evaporated may be irradiated in certain bands, in order to facilitate, for example by conversion into excited states, the evaporation of compounds by dissociation of complexes. It is understood that the evaporation conditions described below are directed to those conditions without irradiation and uniform conditions of evaporation are to be used for purposes of comparison.

The following for example may be used as precursor compounds:
a) mixtures or stoichiometric or mixed crystalline compounds in the dopant and an inert, non-volatile substance, e.g. a polymer, molecular sieve, aluminum oxide, silica gel, oligomers or other organic or inorganic substance with high evaporation temperature, where the dopant is linked to this substance primarily by van der Waals forces and/or hydrogen bridge linkage b) mixture or stoichiometric or mixed crystalline compound of the dopant and one relatively electron donor-like, non-volatile compound V, where relatively complete charge transfer occurs between the dopant and the compound V, such as in charge-transfer complexes with relatively electron-rich polyaromatic compounds or heteroaromatic compounds or other organic or inorganic substance with a high evaporation temperature c) mixture or stoichiometric or mixed crystalline compound of the dopant and a substance that is evaporated together with the dopant and has an ionization energy like or higher than that of the substance HT to be doped, so that the substance in the organic matrix material forms no traps for holes. According to the invention, here the substance may alternatively be identical with the matrix material, for example may represent a metal phthalocyanine or benzidine derivative. Additional suitable volatile co-substances, such as hydroquinones, 1,4-phenylenediamines or 1-amino-4-hydroxybenzes or other compounds, form quinhydrones or other charge-transfer complexes.

Electronic component

Use of the organic compounds according to the invention for the preparation of doped organic semiconducting materials, which may be arranged for example in the form of layers or electrical conduction pathways, permits a multiplicity of electronic components or devices containing them to be produced. In particular, the dopants according to the invention may be used for the production of organic light-emitting diodes (OLEDs), organic solar cells, organic diodes, in particular those with high rectifying behavior such as $10^3$–$10^7$, preferably $10^4$–$10^7$ or $10^5$–$10^7$, or organic field-effect transistors. The dopants according to the invention allow the conductivity of the doped layers and/or the charge-carrier injection of contacts into the doped layer to be improved. In particular, in OLEDs the component may have a pin structure or an inverse structure, without being limited thereto. However, use of the dopants according to the invention is not limited to the advantageous examples mentioned above.

EXAMPLES

The invention is to be explained in detail by several examples.

The compounds to be used according to the invention, in particular the compounds indicated above by way of example in the substance class of quinones or 1,3,2-dioxaborines described above, are used in the following way as dopants for a variety of hole-conductors, which in turn are utilized for the construction of certain microelectronic or optoelectronic components, such as for example an OLED. Here the dopants may be simultaneously evaporated side by side with the hole-transport materials of the matrix under high vacuum (about $2\times10^{-4}$ Pa) at high temperatures. A typical substrate evaporation rate for the matrix material is 0.2 nm/s (thickness about 1.5 g/cm$^3$). Evaporation rates for the dopants may vary between 0.001 and 0.5 nm/s at like assumed thickness, in each instance according to the desired doping ratio. The evaporation temperatures of the compounds in a substrate evaporation means are indicated in the following, where F4TCNQ, under otherwise identical conditions, has an evaporation temperature of 80° C. in order to deposit, in the same specific unit of time (e.g. five seconds) the same layer thickness (e.g. 1 nm) on the substrate as the dopants used according to the invention.

In the following examples the current measurements were performed over a 1 mm-long and about 0.5 mm-wide path of current in the doped HT material at 1 V. Under these conditions ZnPc conducts practically no electric current.

Example 1

Doping of ZnPc with N,N'-dicyano-2,3,5,6-tetrafluoro-1,4-quinonediimine (F4DCNQI)

The evaporation temperature T(evap.) is 85° C. The two components matrix and dopant were deposited from vapor under vacuum in a ratio of 50:1. Here the conductivity is $2.4\times10^{-2}$ s/cm.

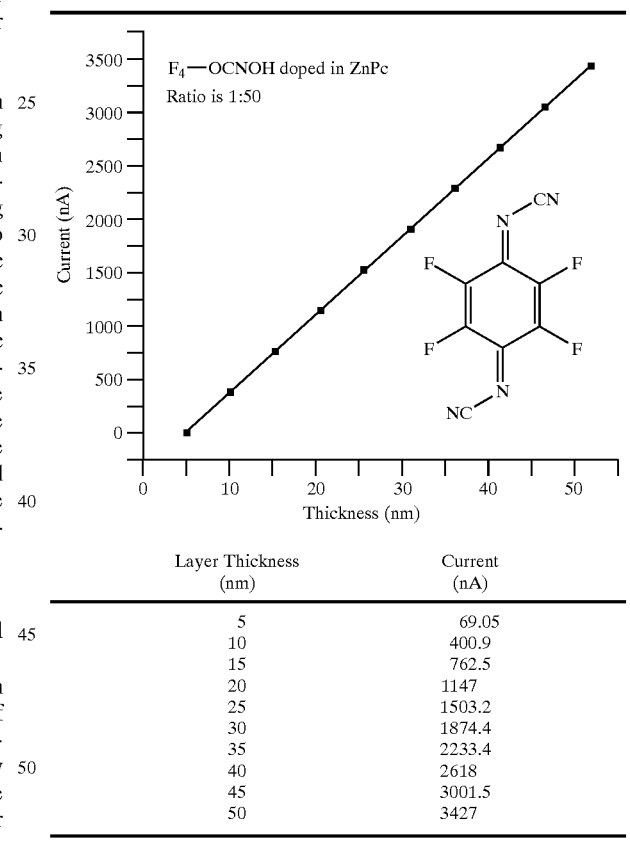

| Layer Thickness (nm) | Current (nA) |
|---|---|
| 5 | 69.05 |
| 10 | 400.9 |
| 15 | 762.5 |
| 20 | 1147 |
| 25 | 1503.2 |
| 30 | 1874.4 |
| 35 | 2233.4 |
| 40 | 2618 |
| 45 | 3001.5 |
| 50 | 3427 |

Example 2

Doping of ZnPc with N,N'-dicyan-2,5-dichloro-1,4-quinonediimine (C12DCNQI)

The evaporation temperature T(evap.) is 114° C. The ratio of the two compounds in the vapor-deposited layer is 1:50 in favor of the matrix. A conductivity of $1.0\times10^{-2}$ s/cm was measure in layer.

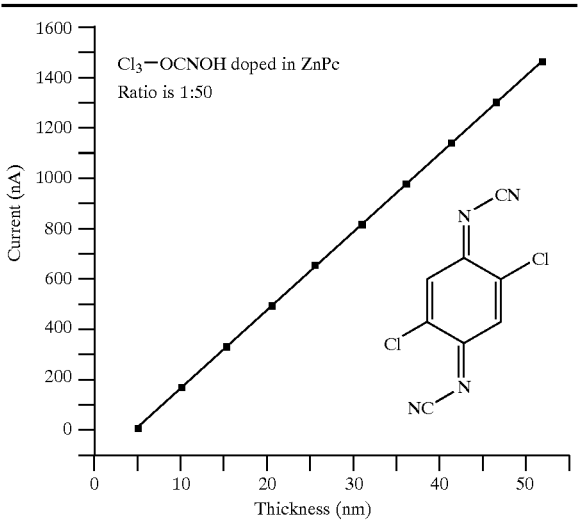

| Layer Thickness (nm) | Current (nA) |
|---|---|
| 5 | 42.66 |
| 10 | 179.4 |
| 15 | 334.2 |
| 20 | 484 |
| 25 | 635.5 |
| 30 | 786 |
| 35 | 946 |
| 40 | 1091.5 |
| 45 | 1253 |
| 50 | 1409.8 |

Example 3

Doping of ZnPc with N,N'-dicyano-2,5-dichloro-3,6-difluoro-1,4-quinonediimine (C12F2DCNQI)

The evaporation temperature T(evap.) is 118° C. The layer was vapor-deposited under vacuum at the ratio of 1:25 (dopant:matrix). A conductivity of $4.9 \times 10^{-4}$ s/cm was measured there.

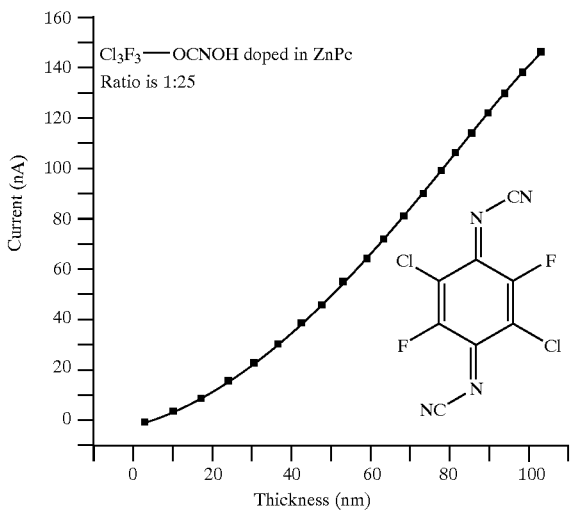

| Layer thickness (nm) | Current (nA) | Layer thickness (nm) | Current (nA) |
|---|---|---|---|
| 5 | 1.1648 | 55 | 66.012 |
| 10 | 4.7852 | 60 | 74.335 |
| 15 | 9.7211 | 65 | 82.449 |
| 20 | 15.582 | 70 | 90.251 |
| 25 | 21.985 | 75 | 97.968 |
| 30 | 28.866 | 80 | 106.14 |
| 35 | 35.45 | 85 | 114.58 |
| 40 | 42.249 | 90 | 122.84 |
| 45 | 49.747 | 95 | 131.1 |
| 50 | 57.86 | 100 | 139.59 |

Example 4

Doping of ZnPc with N,N'-dicyano-2,3,5,6,7,8-hexafluoro-1,4-naphthoquinonediimine (F6DCNNQI)

The evaporation temperature T(evap.) is 122° C. Dopant and matrix were vapor-deposited in the ratio of 1:25 on the carrier under vacuum. A conductivity of $2 \times 10^{-3}$ s/cm was obtained.

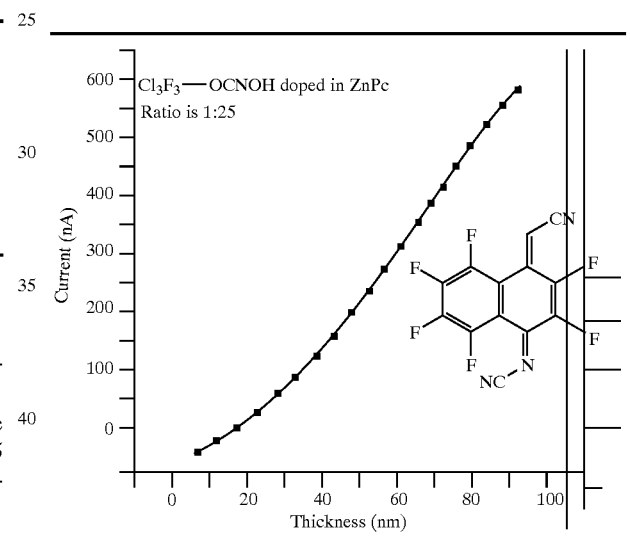

| Layer thickness (nm) | Current (nA) | Layer thickness (nm) | Current (nA) |
|---|---|---|---|
| 5 | 6.4125 | 55 | 300.85 |
| 10 | 26.764 | 60 | 333.18 |
| 15 | 52.096 | 65 | 365.28 |
| 20 | 79.286 | 70 | 397.44 |
| 25 | 107.22 | 75 | 431.58 |
| 30 | 135.36 | 80 | 464.29 |
| 35 | 165.63 | 85 | 498.18 |
| 40 | 199.68 | 90 | 529.63 |
| 45 | 234.01 | 95 | 560.48 |
| 50 | 267.59 | 100 | 590.82 |

Example 5

Doping of ZnPc with 1,4,5,8-tetrahydro-1,4,5,8-tetrathia-2,3,6,7-tetracyanoanthraquinone (CN4TTAQ).

The evaporation temperature T(evap.) is 170° C. The layer was vapor-deposited under vacuum at a ratio of 1:25 (dopant:matrix). A conductivity of $4.5 \times 10^{-4}$ s/cm was measured.

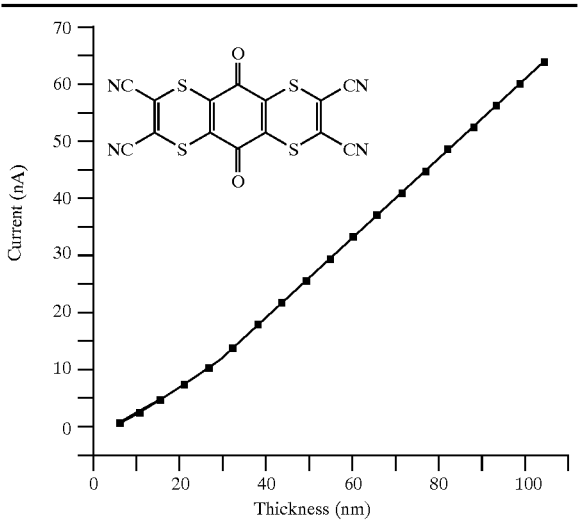

| Layer Thickness (nm) | Current (nA) |
|---|---|
| 10 | 0.94 |
| 15 | 2.43 |
| 20 | 4.46 |
| 30 | 9.84 |
| 40 | 16.33 |
| 50 | 23.66 |
| 60 | 31.54 |
| 70 | 39.6 |
| 80 | 47.5 |
| 90 | 56 |
| 100 | 63.5 |

Example 6

Doping of ZnPc with 2,2,7,7-tetrafluoro-2,7-dihydro-1,3,6,8-doxa-2,7-dibora-pentacholor-benzo[e]pyrene.

The evaporation temperature T(evap.) is 140° C. The layer was vapor-deposited under vacuum at the ratio of 1:25 (dopant:matrix). A conductivity of $2.8 \times 10^{-5}$ s/cm was measured there.

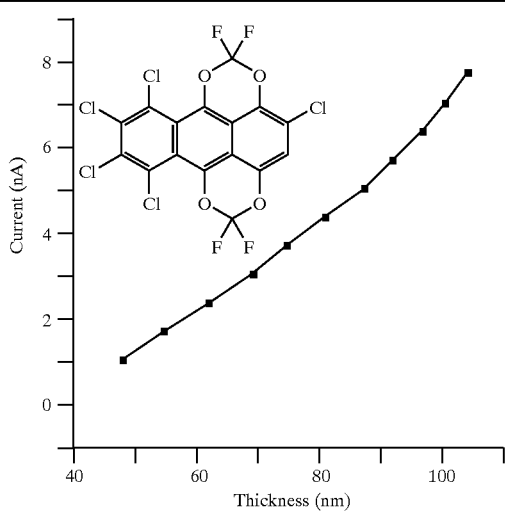

| Layer Thickness (nm) | Current (nA) |
|---|---|
| 50 | 1.12 |
| 55 | 1.49 |
| 60 | 1.89 |
| 65 | 2.32 |
| 70 | 2.88 |
| 75 | 3.56 |
| 80 | 4.25 |
| 85 | 5 |
| 90 | 5.9 |
| 95 | 6.94 |

What is claimed is:

1. A method of doping an organic semiconducting matrix material to vary the electrical properties of the organic semiconducting matrix material comprising depositing an organic mesomeric compound, wherein the mesomeric compound is a quinone or quinone derivative or a 1,3,2-dioxaborine or a 1,3,2-dioxaborine derivative and in that the mesomeric compound, under like evaporation conditions, has a lower volatility than tetrafluorotetracyanoquinonedimethane (F4TCNQ).

2. The method of according to claim 1, wherein the mesomeric quinoid compound has a formula selected from the group consisting of

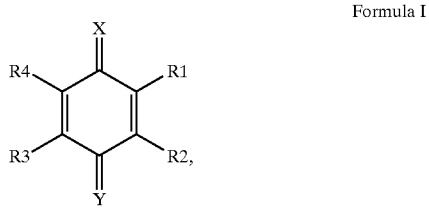

Formula I

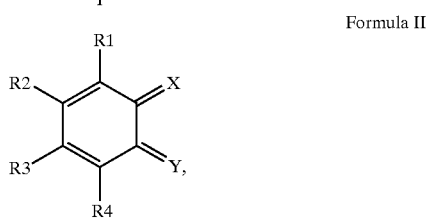

Formula II

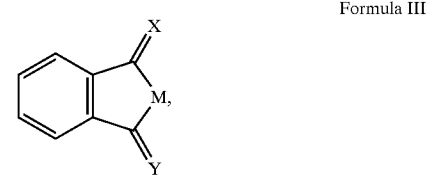

Formula III

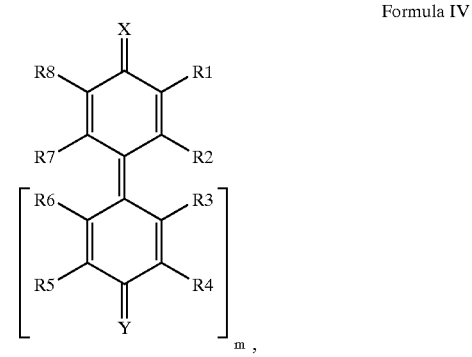

Formula IV

Formula V
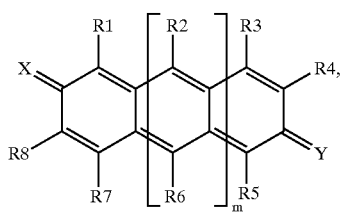
Formula VI
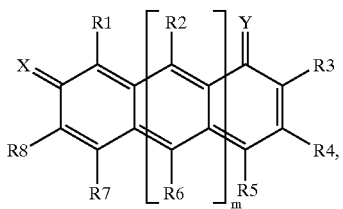
Formula VII
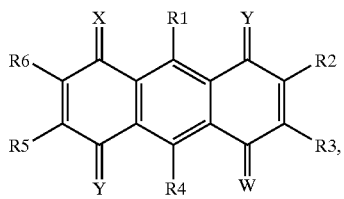
4
Formula VIII
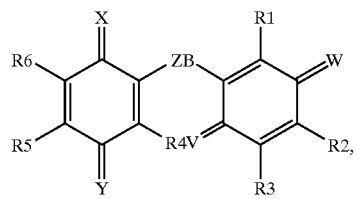
5
Formula IX
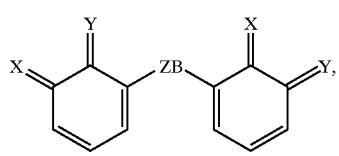
5b
Formula X
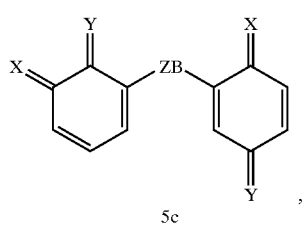
5c
Formula XI
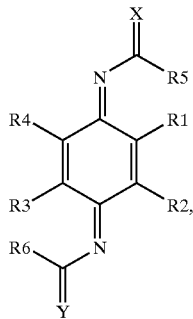
6
Formula XII
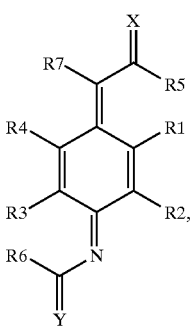
7
Formula XIII
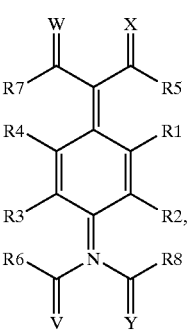
8
Formula XIV
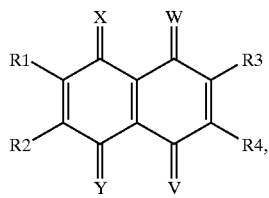
9

Formula XV
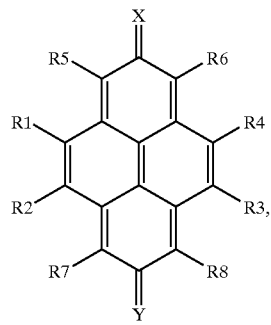
10
Formula XVI
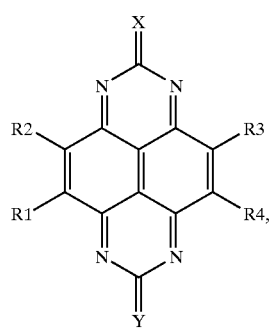
11
Formula XVII
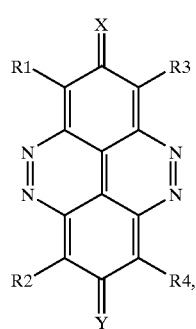
11a
Formula XVIII
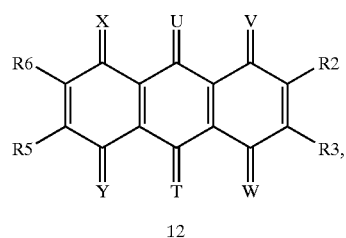
12
Formula XIX
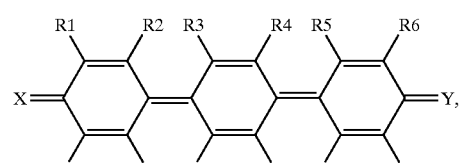
13
Formula XX
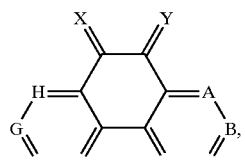
14
Formula XXI
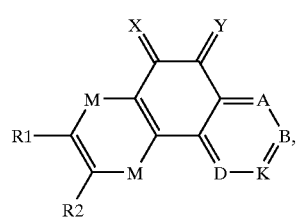
M = O, S, NR = C = V
15
Formula XXII
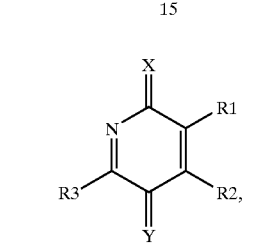
16
Formula XXIII
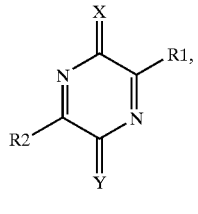
17
Formula XXIV
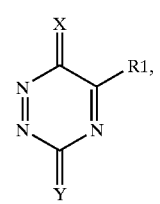
18
Formula XXV
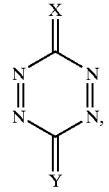
19

Formula XXVI
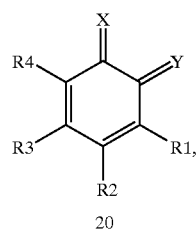
20
Formula XXVII
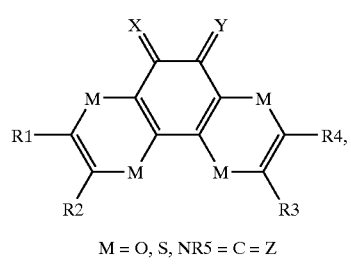
M = O, S, NR5 = C = Z
21
Formula XXVIII
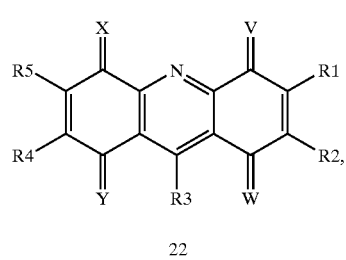
22
Formula XXIX
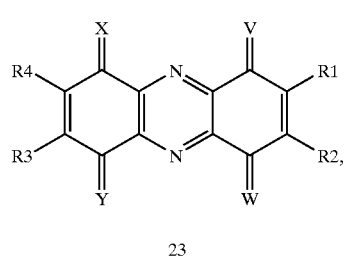
23
Formula XXX
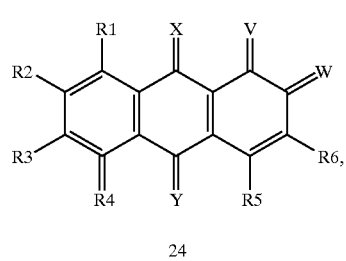
24
Formula XXXI
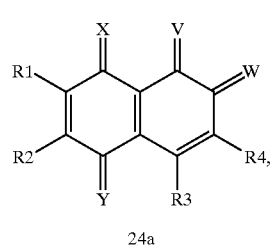
24a
Formula XXXII
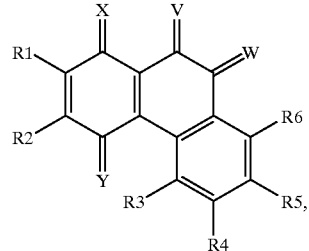
24b
Formula XXXIII
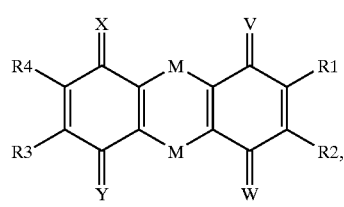
M = O, S, NR5 = C = Z
25
Formula XXXIV
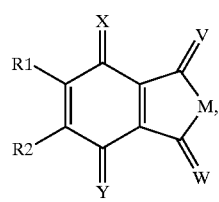
M = O, S, NR3 = C = Z
26
Formula XXXV
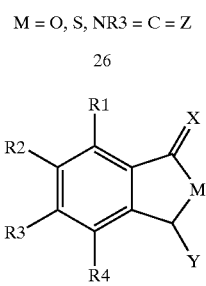
M = O, S, NR5 = C = Z
27
Formula XXXVI
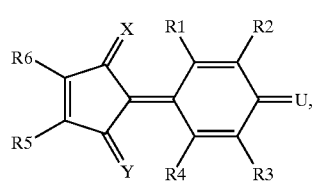
28
Formula XXXVII
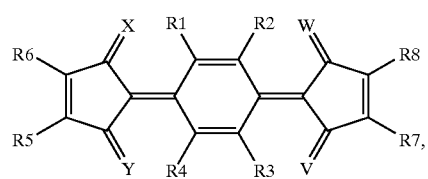
29

Formula XXXVIII

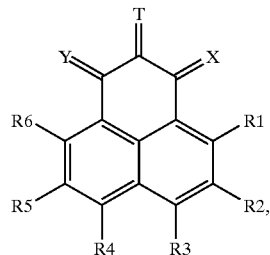

M = O; NR 15 = C = T

30

Formula XXXIX

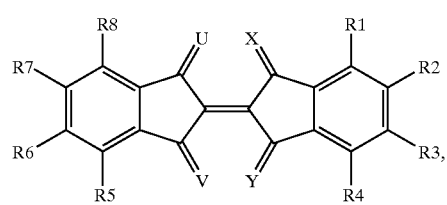

31

Formula XXXX

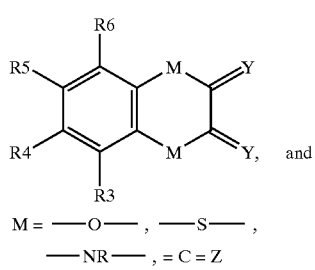

M = —O—, —S—,
—NR—, = C = Z

32

Formula XXXXI

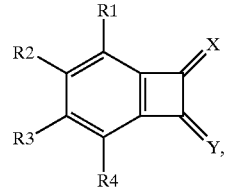

33 wherein m=1, 2, 3, 4 for formula IV,
wherein m=0, 1, 2, 3, 4 for formula V or VI,
wherein the quinoid aromatic ring may be substituted or unsubstituted (R=H) or may be anellated with at least one aromatic ring,
wherein —M— is a bivalent atom or a group with a bivalent bridge atom and where =T, =U, =V, =X, =Y or =Z are double bond-bonded atoms or groups of atoms with mesomerically and/or inductively attracting residues, and
wherein ZB is a divalent atom or a divalent polyatomic bridge.

3. The method according to claim 2, wherein —M— is selected from the group consisting of —O—, —S—, —NR— and —C(=Z)—;
wherein =T, =U, =v, =W, =X, =Y or =Z are alike or unlike and are selected from the group consisting of

 S1

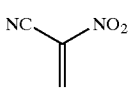 S2

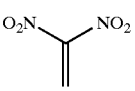 S3

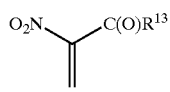 S4

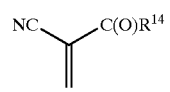 S5

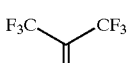 S6

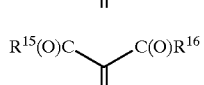 S7

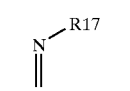 S8

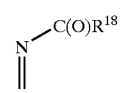 S9

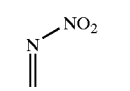 S10

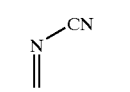 S11

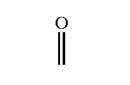 S12

 S13

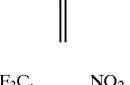 S14

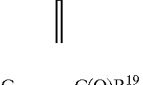 S15

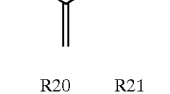 S16

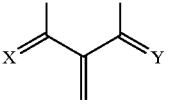 S17

-continued

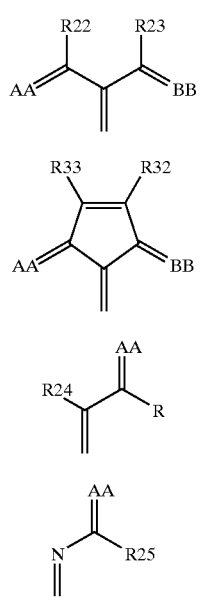

S18

S19

S20

S21 wherein AA is selected from the group consisting of

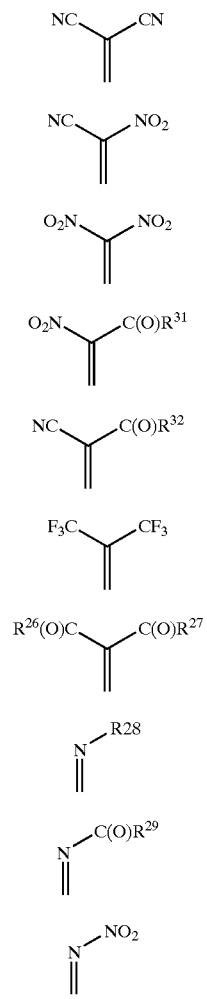

T1

T2

T3

T4

T5

T6

T7

T8

T9

T10

-continued

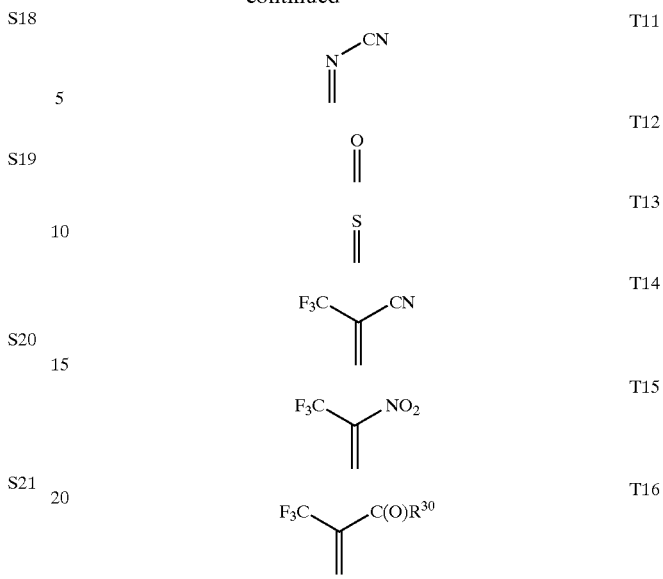

T11

T12

T13

T14

T15

T16 wherein AA may form a multiple-membered ring with another residue R of the compound, wherein Z in the formulas VIII, IX or X represents a direct bond, or a monoatomic or polyatomic group, which may be saturated or unsaturated, and wherein A, B, 0, E, F, G, H, K in the formulas XX and XXI are alike or unlike and are selected from the group =N—, =P—, and =CR—, where R is a hydrogen atom or a residue.

4. The method according to claim 3, wherein T, U, V, W, X, Y and Z are alike or unlike and are selected from the group consisting of

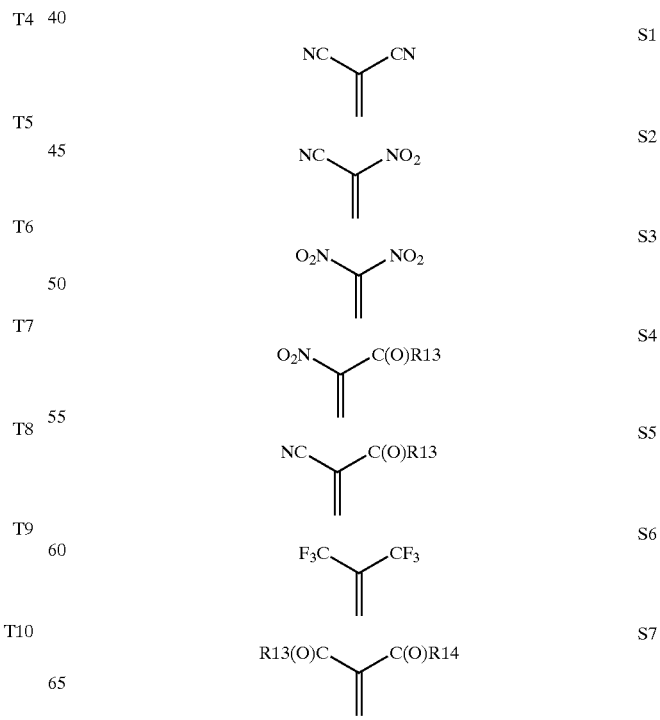

S1

S2

S3

S4

S5

S6

S7

-continued

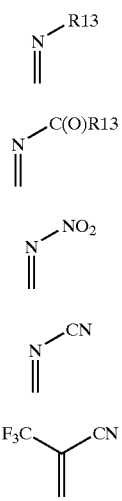

wherein R is an organic residue or hydrogen.

5. The method according to claim 3, wherein T, U, V, W, X, Y and Z are alike or unlike and are selected from the group consisting of

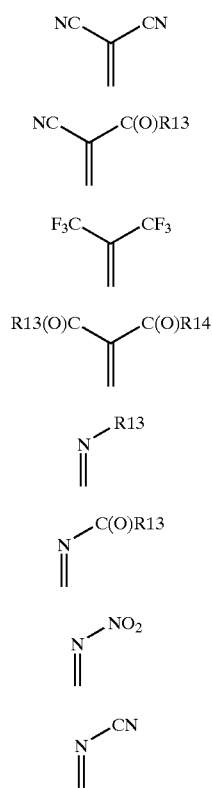

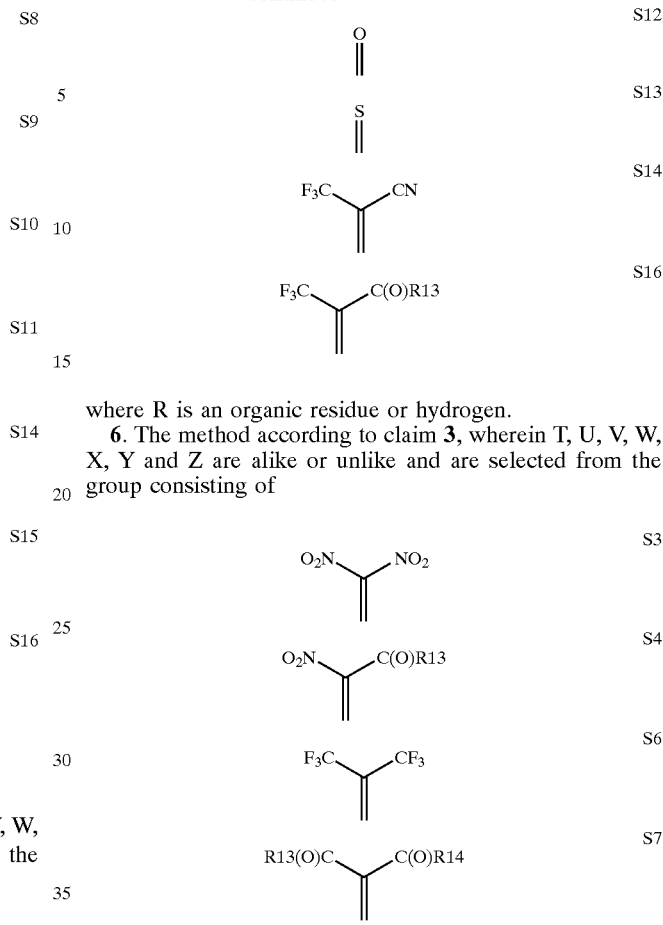

where R is an organic residue or hydrogen.

6. The method according to claim 3, wherein T, U, V, W, X, Y and Z are alike or unlike and are selected from the group consisting of where R is an organic residue or hydrogen, and
wherein R13 of the group S8 is selected from the group consisting of an organic residue, a hydrogen atom or $CF_3$.

7. The method according to claim 1, wherein the organic mesomeric compound is a quinone or quinone derivative having at least two non-anellated quinoid systems, wherein the non-anellated quinoid systems are linked together directly or by a bridge —ZB— with 1 to 10 bridge atoms, wherein the bridge atoms selected are carbon atoms, heteroatoms or carbon atoms and heteroatoms.

8. The method according to claim 1, wherein organic mesomeric compound 2, 3, 4, 5 or 6 has quinoid ring systems with 5 or 6 carbon atoms in each instance, which may be at least partially replaced by heteroatoms.

9. The method according to claim 8, wherein at least two of the quinoid ring systems with mesomeric linkage to a larger quinoid system are anellated or linked together mesomerically by an unsaturated bridge.

10. The method according to claim 1, wherein the compound 1, 2, 3, 4, 5 or 6 contains 1,3,2-dioxaborine rings.

11. The method according to claim 1, wherein at least two of the 1,3,2-dioxaborine rings with mesomeric and/or aromatic linkage are anellated or linked together mesomerically by an unsaturated bridge.

12. The method according to claim 11, wherein the at least two of the 1,3,2-dioxaborine rings with mesomeric and/or aromatic linkage are anellated or linked via additional aromatic rings.

13. The method according to claim 1, wherein the mesomeric 1,3,2-dioxaborine compound has (1) the general formula L Formula L

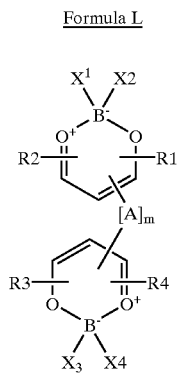

wherein A is a bivalent residue having one or more carbon atoms, which may be partially or completely replaced by heteroatoms, wherein m=0 or is a whole number greater than 0, wherein X is a monodentate ligand, and wherein the two ligands X may form a bidentate ligand, or (2) the general formula Li Formula L1

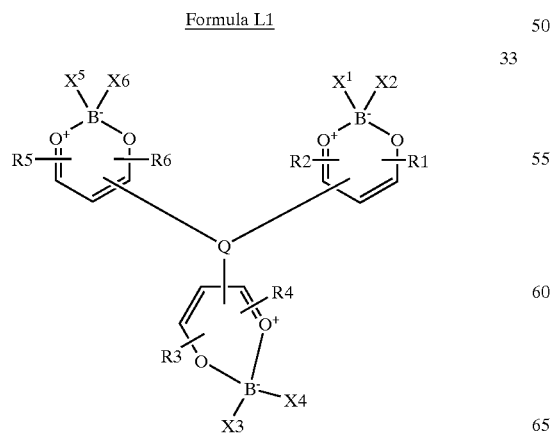

wherein Q is a trivalent residue, wherein X is a monodentate ligand, and wherein the two ligands X may form a bidentate ligand.

14. The method according to claim 13, wherein A is selected from the group consisting of

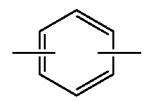

34

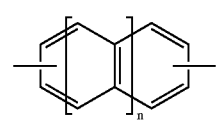

35

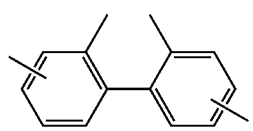

36

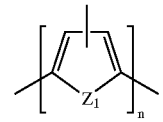

40

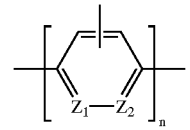

41 and —(C(R1)═C(R2)—) n, wherein n is equal to 1, 2, 3, 4, 5 or 6 and —NR1—, wherein $Z_1$, $Z_2$ and $Z_3$ are bivalent or trivalent atoms, and wherein one or both residues R1, R2 may form a ring with one or both adjacent 1,3,2-dioxaborine rings.

15. The method according to claim 13, wherein Q is selected from the group consisting of

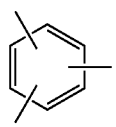

37

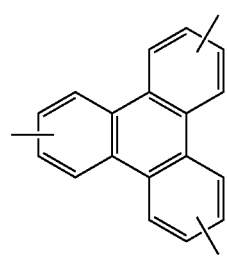

38

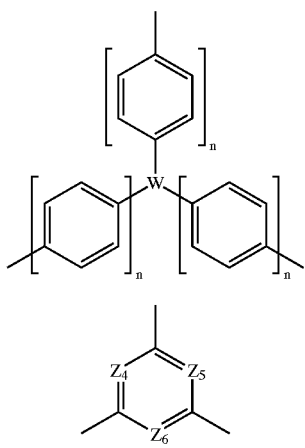

nitrogen, N(aryl)3, phosphorus and P(aryl)3,
wherein aryl comprises heteroaryl,
wherein $Z^4$, $Z^5$ and $Z^6$ are trivalent atoms, and
wherein W is a trivalent atom or a group of trivalent atoms, and
wherein n may be equal to 0, 1, 2, 3 or 4.

16. The method according to claim 13, wherein the mesomeric 1,3,2-dioxaborine compound has the general formula LII Formula LII

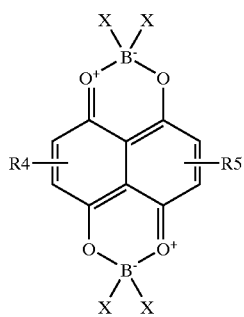

wherein X is a monodentate ligand,
wherein the two ligands X may form a bidentate ligand, and
wherein R4, R5 are organic residues may have 1,3,2-dioxaborine rings.

17. The method according to claim 1, wherein the organic mesomeric compound 1, 2, 3, 4, 5 or 6 has 6 aryl residues,
wherein said aryl residues are anellated with one another or with one or more quinoid systems or with one or more 1,3,2-dioxaborine rings of the compound.

18. The method according to claim 1, wherein the organic mesomeric compound is selected from the group consisting of N,N'-dicyana-2,3,5,6-tetrafluoro-1,4-quinonediimine, N,N'-dicyano-2,5-dichloro- 1,4-quinonediimine, N,N'-dicyano-2,5-dichloro-3,6-difluoro-1,4-quinonediimine, N,N'-dicyano-2,3,5,6,7,8-hexafluoro-1,4-naphthoquinonediimine, 1,4,5,8-tetrahydro-1,4,5,8-tetrathia-2,3,6,7-tetracyanoanthraquinone and 2,2,7,7-tetrafluoro-2,7-dihydro-1,3,6,8-tetraoxa-2,7-diborapentachloro-benzo[e]pyrene.

19. The method according to claim 1, wherein the matrix material is hole-conducting.

20. The method according to claim 1, wherein the matrix material consists partially or completely of a metal phthalocyanine complex, a porphyrin complex, an oligothiophene compound, an oligophenyl compound, an oligophenylenevinylene compound, an oligofluorene compound, a pentacene compound, a compound with a triarylamine unit and/or a spiro-bifluorene compound.

21. The method according to claim 1, wherein the molar doping ratio of dopant to matrix molecule and monomeric unit of a polymeric matrix molecule is between 1:1 and 1:10,000.

22. An organic semiconducting material containing an organic matrix molecule and an organic dopant, wherein the dopant is organic mesomeric compound, wherein the mesomeric compound is a quinone or quinone derivative or a 1,3,2-dioxaborine or a 1,3,2-dioxaborine derivative and in that the mesomeric compound, under like evaporation conditions, has a lower volatility than tetrafluorotetracyanoquinonedimethane (F4TCNQ).

23. The organic semiconducting material according to claim 22, wherein the molar doping ratio of dopant to matrix molecule and monomeric unit of a polymer matrix molecule is between 1:1 and 1:10,000.

24. A method of preparing an organic semiconducting material containing an organic matrix molecule and an organic dopant according to claim 23 comprising evaporating the dopant from a precursor compound which upon heating and/or irradiation releases the dopant.

25. Electronic component having an organic semiconducting material according to claim 23 wherein the organic semiconducting material is doped with an organic dopant for varying the electronic properties of the semiconducting matrix material.

26. The electronic component according to claim 25 in the form of an organic light-emitting diode (OLEO), a photovoltaic cell, an organic solar cell, an organic diode or an organic field-effect transistor.

27. A method of preparing an organic semiconducting material containing an organic matrix molecule and an organic dopant according to claim 22 comprising evaporating the dopant from a precursor compound which upon heating and/or irradiation releases the dopant.

28. Electronic component having an organic semiconducting material according to claim 22 wherein the organic semiconducting material is doped with an organic dopant for varying the electronic properties of the semiconducting matrix material.

29. The electronic component according to claim 28 in the form of an organic light-emitting diode (OLEO), a photovoltaic cell, an organic solar cell, an organic diode or an organic field-effect transistor.

* * * * *